(12) United States Patent
Gao et al.

(10) Patent No.: US 12,136,605 B2
(45) Date of Patent: Nov. 5, 2024

(54) LAYER STRUCTURES FOR MAKING DIRECT METAL-TO-METAL BONDS AT LOW TEMPERATURES IN MICROELECTRONICS AND METHOD FOR FORMING THE SAME

(71) Applicant: ADEIA SEMICONDUCTOR BONDING TECHNOLOGIES INC., San Jose, CA (US)

(72) Inventors: Guilian Gao, San Jose, CA (US); Gaius Gillman Fountain, Jr., Youngsville, NC (US); Laura Wills Mirkarimi, Sunol, CA (US); Rajesh Katkar, Milpitas, CA (US); Ilyas Mohammed, Santa Clara, CA (US); Cyprian Emeka Uzoh, San Jose, CA (US)

(73) Assignee: ADEIA SEMICONDUCTOR BONDING TECHNOLOGIES INC., San Jose, CA (US)

(*) Notice: Subject to any disclaimer, the term of this patent is extended or adjusted under 35 U.S.C. 154(b) by 451 days.

(21) Appl. No.: 17/320,767

(22) Filed: May 14, 2021

(65) Prior Publication Data
US 2022/0005784 A1 Jan. 6, 2022

Related U.S. Application Data

(63) Continuation of application No. 16/218,769, filed on Dec. 13, 2018, now Pat. No. 11,011,494.
(Continued)

(51) Int. Cl.
*H01L 23/522* (2006.01)
*H01L 21/768* (2006.01)
*H01L 23/00* (2006.01)

(52) U.S. Cl.
CPC ........ *H01L 24/83* (2013.01); *H01L 21/76877* (2013.01); *H01L 23/5226* (2013.01);
(Continued)

(58) Field of Classification Search
CPC ......... H01L 24/03; H01L 24/09; H01L 24/16; H01L 24/32; H01L 24/81; H01L 24/83;
(Continued)

(56) References Cited

U.S. PATENT DOCUMENTS 4,612,083 A 9/1986 Yasumoto et al.
4,818,728 A 4/1989 Rai et al.
(Continued)

FOREIGN PATENT DOCUMENTS

CN 105140144 A 12/2015
CN 106653720 A 5/2017
(Continued)

OTHER PUBLICATIONS

Derbyshire, Katherine, "The darker side of hybrid bonding," Semiconductor Engineering, Dec. 17, 2020, https://semiengineering.com/author/katherine/, 6 pages.
(Continued)

*Primary Examiner* — Khiem D Nguyen
(74) *Attorney, Agent, or Firm* — Knobbe, Martens, Olson & Bear, LLP

(57) ABSTRACT

Layer structures for making direct metal-to-metal bonds at low temperatures and shorter annealing durations in microelectronics are provided. Example bonding interface structures enable direct metal-to-metal bonding of interconnects at low annealing temperatures of 150° C. or below, and at a lower energy budget. The example structures provide a precise metal recess distance for conductive pads and vias being bonded that can be achieved in high volume manufacturing. The example structures provide a vertical stack of
(Continued)

conductive layers under the bonding interface, with geometries and thermal expansion features designed to vertically expand the stack at lower temperatures over the precise recess distance to make the direct metal-to-metal bonds. Further enhancements, such as surface nanotexture and copper crystal plane selection, can further actuate the direct metal-to-metal bonding at lowered annealing temperatures and shorter annealing durations.

23 Claims, 11 Drawing Sheets

Related U.S. Application Data

(60) Provisional application No. 62/725,801, filed on Aug. 31, 2018.

(52) U.S. Cl.
CPC ............. *H01L 24/09* (2013.01); *H01L 24/16* (2013.01); *H01L 24/32* (2013.01); *H01L 24/81* (2013.01); *H01L 2924/01029* (2013.01); *H01L 2924/351* (2013.01)

(58) Field of Classification Search
CPC ........... H01L 24/94; H01L 2924/01029; H01L 21/76877; H01L 23/5226; H01L 2402/09; H01L 2402/16; H01L 2402/32; H01L 2402/81; H01L 25/657; H01L 2224/05571; H01L 2924/00012
See application file for complete search history.

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,696,406 A | 12/1997 | Ueno |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,034,393 A | 3/2000 | Sakamoto et al. |
| 6,054,363 A | 4/2000 | Sakaguchi et al. |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,123,825 A | 9/2000 | Uzoh et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,355,153 B1 | 3/2002 | Uzoh et al. |
| 6,359,235 B1 | 3/2002 | Hayashi |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,541,382 B1 | 4/2003 | Cheng et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,720,212 B2 | 4/2004 | Robl et al. |
| 6,759,738 B1 | 7/2004 | Fallon et al. |
| 6,828,686 B2 | 12/2004 | Park |
| 6,837,979 B2 | 1/2005 | Uzoh et al. |
| 6,847,527 B2 | 1/2005 | Sylvester et al. |
| 6,864,585 B2 | 3/2005 | Enquist |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 6,974,769 B2 | 12/2005 | Basol et al. |
| 7,037,755 B2 | 5/2006 | Enquist |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,109,092 B2 | 9/2006 | Tong |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,335,572 B2 | 2/2008 | Tong et al. |
| 7,354,798 B2 | 4/2008 | Pogge et al. |
| 7,387,944 B2 | 6/2008 | Tong et al. |
| 7,485,968 B2 | 2/2009 | Enquist et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,998,335 B2 | 8/2011 | Feeney et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,507,979 B1 | 8/2013 | Huang et al. |
| 8,524,533 B2 | 9/2013 | Tong et al. |
| 8,620,164 B2 | 12/2013 | Heck et al. |
| 8,647,987 B2 | 2/2014 | Yang et al. |

(56) References Cited

U.S. PATENT DOCUMENTS

| | | | |
|---|---|---|---|
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 8,846,450 B2 * | 9/2014 | Tong | H01L 24/11 257/777 |
| 8,916,448 B2 | 12/2014 | Cheng et al. | |
| 8,988,299 B2 | 3/2015 | Kam et al. | |
| 9,040,385 B2 | 5/2015 | Chen et al. | |
| 9,064,937 B2 | 6/2015 | Edelstein et al. | |
| 9,082,627 B2 | 7/2015 | Tong et al. | |
| 9,082,644 B2 | 7/2015 | Ossimitz et al. | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 * | 12/2015 | Landru | H01L 25/50 |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,032 B2 | 5/2016 | Liu et al. | |
| 9,331,149 B2 | 5/2016 | Tong et al. | |
| 9,337,235 B2 | 5/2016 | Chen et al. | |
| 9,343,330 B2 | 5/2016 | Brusic et al. | |
| 9,343,369 B2 * | 5/2016 | Du | H01L 23/528 |
| 9,368,866 B2 | 6/2016 | Yu | |
| 9,385,024 B2 | 7/2016 | Tong et al. | |
| 9,394,161 B2 | 7/2016 | Cheng et al. | |
| 9,425,155 B2 | 8/2016 | Liu et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,704,827 B2 * | 7/2017 | Huang | H01L 23/49838 |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,859,254 B1 | 1/2018 | Yu et al. | |
| 9,865,581 B2 * | 1/2018 | Jang | H01L 27/14643 |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 * | 4/2018 | Enquist | H01L 24/05 |
| 9,960,129 B2 | 5/2018 | Liu et al. | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,090,351 B2 * | 10/2018 | Ashidate | H01L 24/08 |
| 10,103,122 B2 * | 10/2018 | Liu | H01L 24/27 |
| 10,147,641 B2 | 12/2018 | Enquist et al. | |
| 10,204,893 B2 | 2/2019 | Uzoh et al. | |
| 10,211,166 B2 | 2/2019 | Matsuo | |
| 10,269,708 B2 | 4/2019 | Enquist et al. | |
| 10,269,756 B2 | 4/2019 | Uzoh | |
| 10,269,778 B2 | 4/2019 | Lin et al. | |
| 10,276,619 B2 | 4/2019 | Kao et al. | |
| 10,276,909 B2 | 4/2019 | Huang et al. | |
| 10,312,275 B2 | 6/2019 | Hynecek | |
| 10,418,277 B2 | 9/2019 | Cheng et al. | |
| 10,431,614 B2 | 10/2019 | Gambino et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,672,654 B2 | 6/2020 | Uzoh et al. | |
| 10,707,087 B2 | 7/2020 | Uzoh et al. | |
| 10,790,262 B2 | 9/2020 | Uzoh et al. | |
| 10,796,913 B2 | 10/2020 | Lin | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,413 B2 | 2/2021 | DeLaCruz | |
| 10,937,755 B2 | 3/2021 | Shah et al. | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |
| 11,171,117 B2 | 11/2021 | Gao et al. | |
| 11,176,450 B2 | 11/2021 | Teig et al. | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 11,552,041 B2 | 1/2023 | Fountain, Jr. et al. | |
| 2002/0000328 A1 | 1/2002 | Motomura et al. | |
| 2002/0003307 A1 | 1/2002 | Suga | |
| 2002/0025665 A1 | 2/2002 | Juengling | |
| 2002/0074670 A1 | 6/2002 | Suga | |
| 2002/0094661 A1 | 7/2002 | Enquist et al. | |
| 2002/0113241 A1 | 8/2002 | Kubota et al. | |
| 2003/0092220 A1 | 5/2003 | Akram | |
| 2003/0109083 A1 | 6/2003 | Ahmad | |
| 2003/0129796 A1 | 7/2003 | Bruchhaus et al. | |
| 2003/0157748 A1 | 8/2003 | Kim et al. | |
| 2004/0072423 A1 * | 4/2004 | Jorne | C25D 17/001 257/E21.585 |
| 2004/0084414 A1 | 5/2004 | Sakai et al. | |
| 2004/0126990 A1 | 7/2004 | Ohta | |
| 2004/0157407 A1 | 8/2004 | Tong et al. | |
| 2004/0217483 A1 | 11/2004 | Hedler et al. | |
| 2004/0262772 A1 | 12/2004 | Ramanathan et al. | |
| 2005/0104224 A1 | 5/2005 | Huang et al. | |
| 2005/0181542 A1 | 8/2005 | Enquist | |
| 2006/0024950 A1 | 2/2006 | Choi et al. | |
| 2006/0057945 A1 | 3/2006 | Hsu et al. | |
| 2006/0138368 A1 | 6/2006 | Lee | |
| 2007/0096294 A1 | 5/2007 | Ikeda et al. | |
| 2007/0111386 A1 | 5/2007 | Kim et al. | |
| 2007/0212870 A1 | 9/2007 | Yang et al. | |
| 2007/0222048 A1 | 9/2007 | Huang | |
| 2007/0257366 A1 | 11/2007 | Wang et al. | |
| 2007/0295456 A1 | 12/2007 | Gudeman et al. | |
| 2008/0122092 A1 | 5/2008 | Hong | |
| 2009/0108469 A1 | 4/2009 | Kang et al. | |
| 2009/0197408 A1 | 8/2009 | Lehr et al. | |
| 2009/0200668 A1 | 8/2009 | Yang et al. | |
| 2010/0164066 A1 | 7/2010 | Di Franco | |
| 2011/0074040 A1 | 3/2011 | Frank et al. | |
| 2011/0290552 A1 | 12/2011 | Palmateer et al. | |
| 2012/0211894 A1 | 8/2012 | Aoyagi | |
| 2012/0212384 A1 | 8/2012 | Kam et al. | |
| 2012/0319280 A1 | 12/2012 | Suganuma et al. | |
| 2013/0020704 A1 | 1/2013 | Sadaka | |
| 2013/0034948 A1 | 2/2013 | Huang et al. | |
| 2013/0075900 A1 | 3/2013 | Shim et al. | |
| 2013/0078783 A1 | 3/2013 | Nieh et al. | |
| 2013/0187287 A1 | 7/2013 | Park et al. | |

(56) References Cited

U.S. PATENT DOCUMENTS

| | | |
|---|---|---|
| 2013/0221527 A1 | 8/2013 | Yang et al. |
| 2013/0256913 A1 | 10/2013 | Black et al. |
| 2013/0284885 A1 | 10/2013 | Chen et al. |
| 2013/0320556 A1 | 12/2013 | Liu et al. |
| 2013/0328186 A1 | 12/2013 | Uzoh et al. |
| 2014/0131869 A1 | 5/2014 | Pendse |
| 2014/0145338 A1 | 5/2014 | Fujii et al. |
| 2014/0175655 A1 | 6/2014 | Chen et al. |
| 2014/0206109 A1 | 7/2014 | Ossimitz et al. |
| 2014/0217593 A1* | 8/2014 | Chen ................... B23K 1/0016 257/762 |
| 2014/0225795 A1 | 8/2014 | Yu |
| 2014/0252635 A1 | 9/2014 | Tran et al. |
| 2014/0264948 A1 | 9/2014 | Chou et al. |
| 2014/0332980 A1 | 11/2014 | Sanders et al. |
| 2015/0064498 A1 | 3/2015 | Tong |
| 2015/0096798 A1 | 4/2015 | Uzoh |
| 2015/0097022 A1 | 4/2015 | Di Cioccio et al. |
| 2015/0108644 A1 | 4/2015 | Kuang et al. |
| 2015/0155263 A1 | 6/2015 | Farooq et al. |
| 2015/0200073 A1 | 7/2015 | Jen et al. |
| 2015/0206823 A1 | 7/2015 | Lin et al. |
| 2015/0214191 A1 | 7/2015 | Lee et al. |
| 2015/0228621 A1 | 8/2015 | Kumar et al. |
| 2015/0307819 A1 | 10/2015 | Ida et al. |
| 2015/0340269 A1 | 11/2015 | Rivoire et al. |
| 2015/0340371 A1 | 11/2015 | Lue |
| 2015/0364434 A1 | 12/2015 | Chen et al. |
| 2016/0086923 A1 | 3/2016 | Best |
| 2016/0148816 A1 | 5/2016 | Lee et al. |
| 2016/0163684 A1* | 6/2016 | Chou ................... H01L 21/764 438/107 |
| 2016/0181228 A1 | 6/2016 | Higuchi et al. |
| 2016/0190103 A1* | 6/2016 | Kabe ................... H01L 23/564 257/777 |
| 2016/0322414 A1 | 11/2016 | Chen et al. |
| 2016/0343682 A1 | 11/2016 | Kawasaki |
| 2017/0053897 A1 | 2/2017 | Lai et al. |
| 2017/0179029 A1 | 6/2017 | Enquist et al. |
| 2017/0194271 A1 | 7/2017 | Hsu et al. |
| 2017/0250160 A1 | 8/2017 | Wu et al. |
| 2017/0278698 A1 | 9/2017 | Ikegawa et al. |
| 2017/0365487 A1 | 12/2017 | Shen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0204798 A1 | 7/2018 | Enquist et al. |
| 2018/0219038 A1 | 8/2018 | Gambino et al. |
| 2018/0226371 A1 | 8/2018 | Enquist |
| 2018/0226375 A1 | 8/2018 | Enquist et al. |
| 2018/0269325 A1 | 9/2018 | Cheng et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0350674 A1 | 12/2018 | Uzoh |
| 2019/0035767 A1* | 1/2019 | Yu .......................... H01L 21/56 |
| 2019/0057756 A1 | 2/2019 | Kim et al. |
| 2019/0088535 A1 | 3/2019 | Yan et al. |
| 2019/0096741 A1 | 3/2019 | Uzoh et al. |
| 2019/0096842 A1 | 3/2019 | Fountain, Jr. et al. |
| 2019/0109042 A1 | 4/2019 | Katkar et al. |
| 2019/0115277 A1 | 4/2019 | Yu et al. |
| 2019/0131277 A1 | 5/2019 | Yang et al. |
| 2019/0157334 A1 | 5/2019 | Wei et al. |
| 2019/0189603 A1 | 6/2019 | Wang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035630 A1 | 1/2020 | Kameshima |
| 2020/0035641 A1 | 1/2020 | Fountain, Jr. et al. |
| 2020/0075520 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0118156 A1 | 4/2023 | Gao et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |

(56) References Cited

U.S. PATENT DOCUMENTS

| | | |
|---|---|---|
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |

FOREIGN PATENT DOCUMENTS

| | | |
|---|---|---|
| CN | 106920795 A | 7/2017 |
| CN | 107039380 A | 8/2017 |
| CN | 107731668 A | 2/2018 |
| CN | 107993927 A | 5/2018 |
| CN | 107993928 A | 5/2018 |
| CN | 109155301 A | 1/2019 |
| CN | 109417073 A | 3/2019 |
| CN | 109417075 A | 3/2019 |
| CN | 109417077 A | 3/2019 |
| CN | 109643643 A | 4/2019 |
| CN | 109844915 A | 6/2019 |
| EP | 0 465 227 A2 | 1/1992 |
| EP | 2 863 420 A1 | 4/2015 |
| JP | 61-030059 | 2/1986 |
| JP | 01-168040 | 7/1989 |
| JP | 4-259249 | 9/1992 |
| JP | 05-029183 | 2/1993 |
| JP | 5-198739 | 8/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2013-033786 A | 2/2013 |
| JP | 2013-033900 A | 2/2013 |
| JP | 2013-243333 | 12/2013 |
| JP | 2018-160519 | 10/2018 |
| JP | 2019-129199 | 8/2019 |
| KR | 10-2012-0106366 | 9/2012 |
| KR | 10-2015-0097798 | 8/2015 |
| TW | 476145 | 2/2002 |
| WO | WO 01/61743 A1 | 8/2001 |
| WO | WO 03/054954 A2 | 7/2003 |
| WO | WO 2005/043584 A2 | 5/2005 |
| WO | WO 2006/100444 A1 | 9/2006 |
| WO | WO 2012/013162 A1 | 2/2012 |
| WO | WO 2016/185883 A1 | 11/2016 |
| WO | WO 2017/151442 A1 | 9/2017 |
| WO | WO 2017/155002 A1 | 9/2017 |
| WO | WO 2019/146427 A1 | 8/2019 |

OTHER PUBLICATIONS

Extended European Search Report dated Jan. 10, 2022, European Application No. 19853599.9, 18 pages.

Samsung Galaxy S7 Edge Teardown, posted Apr. 24, 2016, contributing authors: Jim Morrison, Ray Fontaine, Dick James and Daniel Yang, https://www.techinsights.com/blog/samsung-galaxy-s7-edge-teardown, last accessed on May 16, 2022, 6 pages.

Gao, Guilian et al., "Scaling package interconnects below 20 m pitch with hybrid bonding," 2018 IEEE 68th Electronic Components and Technology Conference (ECTC), IEEE, May 29, 2018, pp. 314-322, XP033380016.

Sart C., et al., "Cu/SiO2 hybrid bonding; Finite element modeling and experimental characterization," 2016 6th Electronic System-Integration Technology Conference (ESTC), IEEE, Sep. 13, 2016, pp. 1-7, XP033015798.

Amirfeiz et al., "Formation of silicon structures by plasma-activated wafer bonding," Journal of The Electrochemical Society, 2000, vol. 147, No. 7, pp. 2693-2698.

Appeal Decision of Rejection issued on Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Canadian Office Action issued Aug. 1, 2013 in Canadian Patent Application No. 2,618,191, 4 pages.

Canadian Office Action, mailed May 16, 2012 for Canadian Patent Application No. 2,515,375, with international preliminary report, 2 pages.

Ceramic Microstructures: Control at the Atomic Level, Recent Progress in Surface Activated Bonding, 1998, pp. 385-389.

"Chemical Mechanical Polishing (CMP) Metrology with Advanced Surface Polisher," Park Systems, 4 pages.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

D'Agostino, R., "Plasma etching of Si and SiO2 in SF6—O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Richard A. Blanchard in Support of Petition for inter partes review of U.S. Pat. No. 7,485,968, dated Jun. 13, 2013, pp. 1-18.

Dysard, Jeffrey M. et al., "CMP solutions for the integration of high-k metal gate technologies," ECS Transactions, 2010, vol. 33, Issue 10, pp. 77-89.

Fan et al., "Copper water bonding," Electrochem. Solid-State Lett., U.S.A., The Electrochemical Society, Aug. 6, 1999, vol. 2, No. 10, pp. 534-536.

Fang, S.J. et al., "Advanced process control in dielectric chemical mechanical polishing (CMP)," Texas Instruments, Silicon Technology Development, 8 pages.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Final Written Decision, Inter PartesReview, U.S. Pat. No. 7,485,968, Case IPR2013-00381, dated Feb. 27, 2014, in 3 pages.

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding," Proceedings of the Second International Symposium on Semiconductor Wafer

(56) References Cited

OTHER PUBLICATIONS

Bonding: Science, Technology and Applications, The Electrochemical Society Proceedings, vol. 93-29 (1993), pp. 395-409.
Handbook of Thin Film Technology, Maissel and Glang, 1983 Reissue, pp. 12-24.
Harendt, C. et al., "Vertical polysilicon interconnects by aligned wafer bonding," Electrochemical Society Proceedings, 1998, vol. 97-36, pp. 501-508.
Hayashi, Y. et al., "Fabrication of three-dimensional IC using cumulatively bonded IC (CUBIC) technology," VSLI Tech. Dog., 1990, pp. 95-96.
Hizukuri, M. et al., "Dynamic strain and chip damage during ultrasonic flip chip bonding," Jpn. J. Appl. Phys. 40, 2001, pp. 3044-3048.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
"Hybrid Bonding—Patent Landscape Analysis," from Technologies to IP Business Intelligence, KnowMade Patent & Technology Intelligence, www.kmowmade.com, Nov. 2019, 81 pages.
Hymes, S. et al., "Determination of the planarization distance for copper CMP process," 6 pages.
Iida, A. et al., "The study of initial mechanism for Al—Au solid phase diffusion flip-chip bonding," Jpn. J. Appl. Phys. 40, 1997, pp. 3044-3661.
International Search Report and Written Opinion mailed Apr. 22, 2019 in International Application No. PCT/US2018/064982, 13 pages.
International Search Report and Written Opinion mailed Mar. 7, 2019, in International Application No. PCT/US2018/060044, 14 pages.
International Search Report and Written Opinion, dated Jan. 10, 2019, for PCT Application No. PCT/US2018/051537, 3 pages.
International Search Report and Written Opinion mailed Oct. 8, 2019, in International Application No. PCT/US2019/037072, 13 pages.
International Search Report and Written Opinion mailed Dec. 6, 2019, in International Application No. PCT/US2019/047513, 12 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kissinger, G. et al., "Void-free silicon-wafer-bond stregthening in the 200-400 C. range," Sensors and Actuators A, 1993, vol. 36, pp. 149-156.
Krauter, G. et al., "Low temperature silicon direct bonding for application in micromechanics: bonding energies for different combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, vol. 63, No. 3, pp. 185-189.
Lee, D. et al., "Slurry components in metal chemical mechanical planarization (CMP) process: A review," International Journal of Precision Engineering and Manufacturing, Dec. 2016, vol. 17, No. 12, pp. 1751-1762.
Li, Yuzhuo, "Key factors that influence step height reduction efficiency and defectivity during metal CMP," Clarkson University, Levitronix CMP Users' Conference 2006, 2006, 32 pages.
Li, Y.A. et al., "Low temperature copper to copper direct bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Liu, Zi-Yu et al. "Detection and formation mechanism of microdefects in ultrafine pitch Cu—Cu direct bonding," Chin. Phys. B, 2016, vol. 25, No. 1, pp. 018103-1-018103-7.
Liu, C. et al., "Low-temperature direct copper-to-copper bonding enabled by creep on (111) surfaces of nanotwinned Cu," Scientific Reports, May 12, 2015, 5:09734, pp. 1-11.
Lu, L. et al., "Grain growth and strain release in nanocrystalline copper," Journal of Applied Physics, vol. 89, Issue 11, pp. 6408.
Luo, Ying, "Slurry Chemistry Effects On Copper Chemical Mechanical Planarization," University of Central Florida STARS, Electronic Theses and Disserations, 2004, Paper 36, 111 pages.
Matsuzawa et al., "Room-temperature interconnection of electroplated Au microbump by means of surface activated bonding method," Electornic Components and Technology Confererence, 2001, 51st Proceedings, IEEE, pp. 384-387.
Monsma et al., "Development of the spin-valve transistor," IEEE Tran. Magnet., vol. 33, No. 5, Sep. 1997, pp. 3495-3499.
Moriceau, H. et al., "Overview of recent direct wafer bonding advances and applications," Advances in Natural Sciences—Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.

(56) References Cited

OTHER PUBLICATIONS

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Ortleb, Thomas et al., "Controlling macro and micro surface topography for a 45nm copper CMP process using a high resolution profiler," Proc. Of SPIE, 2008, vol. 6922, 11 pages.
Paul, E. et al., "A model of copper CMP," J. Electrochem. Soc., 2005, vol. 152, Issue 4, pp. G322-G328.
Petition for Inter Partes Review of U.S. Pat. No. 7,485,968, IPR 2013-00381, filed Jun. 21, 2013, pp. 1-49.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Rhoades, Robert L., "The Dark Art of CMP," Future Fab International, Issue 24, 10 pages.
Roberds et al., "Low temperature , in situ, plasma activated wafer bonding," Electrochecmical Society Proceedings, 1997, vol. 97-36, pp. 598-606.
Rosales-Yeomans, D. et al., "Evaluation of pad groove designs under reduced slurry flow rate conditions during copper CMP," Journal of The Electrochemical Society, 2008, vol. 155, No. 10, pp. H812-H818.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Steinkirchner, J. et al., "Silicon wafer bonding via designed monolayers," Advanced Materials, 1995, vol. 7, No. 7, 7 pages.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. Vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (exerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: science and technology," 1999, 120 pages.
Tong, Q.Y. et al., "Semiconductor wafer bonding: science and technology," 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies for wafer-level bonding of 3D MEMS and integrated circuit structures," 2004 Electronics Components and Technology Conference, 2004 IEEE, pp. 931-938.
Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold—gold thermocompression bonds," Mater. Soc. Symp. Proc. 605, 1999, pp. 171-176.
Vossen, J. et al., "Thin Film Processes II," Academic Press, 1991, 62 pages.
Vossen, J. et al., "Thin Film Processes," Academic Press, 1978, 62 pages.

(56) References Cited

OTHER PUBLICATIONS

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method," Microelectronics Reliability, May 2003, vol. 43, Issue 5, pp. 751-756.

Warner, K. et al., "Low-temperature oxide-bonded three-dimensional integrated circuits," IEEE International SOI Conference, Oct. 2012, pp. 123-125.

Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.

Wikipedia, "Chemical bond," URL http://en.wikipedia.org/wiki/chemical_bond, accessed on Mar. 31, 2010, 10 pages.

Wikipedia, "Van der Waals force," URL https://en.wikipedia.org/wiki/Van_der_Waals_force, originally accessed on Mar. 31, 2010, 7 pages.

Xu et al., "New Au—Al interconnect technology and its reliability by surface activated bonding," Electronic Packaging Technology Proceedings, Oct. 28-30, 2003, Shanghai, China, pp. 479-483.

Yablonovitch, E. et al., "Van der Waals bonding of GaAs on Pd leads to a permanent, solid-phase-topotaxial metallurgical bond," Appl. Phys. Lett. 59, 1991, pp. 3159-3161.

Image showing a partial cross-section of Sony IMX260 BSI image sensor from Samsung Galaxy S7; product believed to be released Mar. 2016.

Image showing a partial cross-section of Omnivision OV16B10 16MP BSI image sensor from Huawei P20 Lite Phone; product believed to be released May 2018.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

* cited by examiner

LAYER STRUCTURES FOR MAKING DIRECT METAL-TO-METAL BONDS AT LOW TEMPERATURES IN MICROELECTRONICS AND METHOD FOR FORMING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Making electrical connections at bonding interfaces has become paramount in microelectronics, as the transistor density that can be arrayed in a given 2-dimensional area has doubled every 18-24 months, for decades. Conventional flip chip connectors between semiconductor die and circuit board provide 45 contact bump connections per square millimeter (sq. mm), with each connection averaging 180 microns (μm) in bonding pitch. Conventional micropillar connectors improve upon conventional flip chip connectors, providing 625 pillar connections per sq. mm, with each connection averaging 40 μm in pitch. Bond pad width may be considered the size of the conductive pads to be bonded, while pitch refers to the distance between connections. Making 1,000,000 connections per sq. mm requires a bond pitch of 1 μm, for example, with a pad size that is likely around 0.5 μm. For wafer-to-wafer or die-to-wafer bonding that includes electrical interconnects, direct bonding techniques that include direct metal-to-metal bonding, such as "direct bond interconnect" (DBI® brand) direct hybrid bonding, can provide 100,000-1,000,000 connections per sq. mm, with each connection averaging from <1 μm-40 μm in pitch (Invensas Inc., a subsidiary of Xperi Corp., San Jose, CA). Even greater connection density is feasible with connections that are less than 1 μm in pitch.

Direct hybrid bonding processes, such as DBI® direct hybrid bonding, presuppose ultra-flat bonding surfaces, and so high density connections to be made by such direct bonding rely on varieties of chemical-mechanical planarization (CMP) processes to make the surfaces to be bonded flat to within a few ten-thousandths of a micron (within a few tenths of a nanometer) over a large surface. Various CMP processes can achieve a depth-of-field flatness sufficient for photolithography, or sufficient for 22 nanometer node technology, for example.

To achieve such exceptionally fine-pitch 3D electrical interconnects at ultra-high density, the alignment and bonding processes must also be finely tuned. The alignment and dielectric (nonmetal) bonding parts of the direct hybrid bonding process can be performed at room temperature. The dielectric portions of the bonding surfaces (for example, silicon oxide) forms oxide-to-oxide bonding spontaneously when the prepared surfaces are bought together. The metal pads or vias that are confined in the dielectric material, however, are slightly recessed from the dielectric surface that makes up the horizontal bonding interface, such that the metal pads do not impede bonding of the dielectric surfaces upon contact of the dielectric surfaces with each other.

Conventional annealing stages of direct hybrid bonding processes are at a raised temperature. At these higher annealing temperatures, the metal pads or vias expand vertically more than the surrounding dielectric material, due to the difference in coefficients of thermal expansion (CTEs) between metals and dielectrics. If the recess is sufficiently shallow, the metal vias or pads on each side of the surface being bonded will expand to bridge the small gap between the two metal surfaces and form a physical contact with each other at a certain self-expansion. The oxide-to-oxide bonding of the dielectrics around the metal pads further strengthens at these higher annealing temperatures to allow the metal pads to expand into each other and permanently bond. Bonding between metal pads initiates when copper atoms (for example, for copper pads) at each surface begin to make mutual metallic bonds with other copper atoms on the other side of the interface. No solder or other adhesives are used in the direct hybrid bonding process of electrical interconnects in this manner.

But the temperatures used in conventional annealing steps for direct hybrid bonding can place thermal stress on ever-smaller semiconductor components used in microelectronics. This annealing temperature could be lowered, but thermal expansion at lower temperatures is limited and requires very precise control of copper pad placement with respect to the recess distance of the metal pads from the bonding interface at room temperature, a precise control that is difficult to achieve in high volume manufacturing. This recess distance results from the CMP step, resulting in a very narrow manufacturing window that is impractical: any slight protrusion of the metal pad above the horizontal plane of the bonding interface composed of the dielectric surface can impede the spontaneous dielectric bonding phase of the direct hybrid bonding process that occurs at room temperature, and this causes overall bonding failure. Structures and processes that could otherwise lower the annealing temperature for direct metal-to-metal bonding of interconnects are desirable for further progress in 3D semiconductor packaging.

SUMMARY

Layer structures for making direct metal-to-metal bonds at low temperatures and shorter annealing duration in microelectronics are provided. Example bonding interface structures enable direct metal-to-metal bonding of interconnects at low annealing temperatures of 150° C. or below, and at a lower energy budget due to shorter annealing times. The example structures provide a precise metal recess distance for conductive pads and vias being bonded that can be achieved in high volume manufacturing. The example structures provide a vertical stack of conductive layers confined by a surrounding dielectric with geometries and thermal expansion features designed to vertically expand the stack over the precise recess distance at lower temperatures to make the direct metal-to-metal bonds at the bonding interface without solders or adhesives. Further enhancements, such as surface nanotexture and copper crystal plane selection, can further actuate the direct metal-to-metal bonding at lowered annealing temperatures and shorter annealing durations.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It

DETAILED DESCRIPTION

Overview

This disclosure describes layer structures for making direct metal-to-metal bonds at low temperatures and short annealing durations in microelectronics. Example bonding interface structures enable direct metal-to-metal bonding of interconnects at low annealing temperatures of 150° C. or below. The example structures provide a precise metal recess specification of 4-6 nanometers, for example, that can be achieved in high volume manufacturing. In direct hybrid bonding, direct bonding of dielectric surfaces occurs first across a bonding interface. Then, in an anneal stage, the recessed vias or pads at the precise recess distance can expand at a low annealing temperature and shorter annealing duration to bridge the gap and form direct metal-to-metal bonds.

Reducing the energy budget or "thermal budget" for creating direct hybrid bonds, including metal-to-metal bonding of conductive interconnects, includes not only lowering annealing temperatures but also lowering the duration of the annealing phase of hybrid bonding. Example techniques are also described herein for shortening the annealing duration.

Significantly, example structures enabling direct hybrid bonds to be formed at a reduced energy budget allow hundreds-of-thousands or even over one-million electrical interconnects per square millimeter to be completed at lower temperatures and lower energy budget than temperatures conventionally applied in direct hybrid bonding of metal interconnects. Direct bonding can be accomplished either through thermal compression bonding or hybrid bonding. Hybrid bonding is described herein as an example. The example low-temperature processes are safer for semiconductor components and fabrication apparatuses, and also less expensive to implement. The example low-temperature processes also enable application of direct hybrid bonding to components and products that cannot be annealed at conventional annealing temperatures of 250° C. and above.

Example Bonding Interface Structures

Low-temperature direct metal-to-metal bonding is attractive for some applications. But the vertical thermal expansion needed to bond metals together in direct hybrid bonding processes is limited at lower temperatures compared with the vertical thermal expansion achievable at those annealing temperatures used conventionally, triggering a need for precise control of the structure of the bonding interface before the bonding can occur at the lower temperatures.

Figure 1:
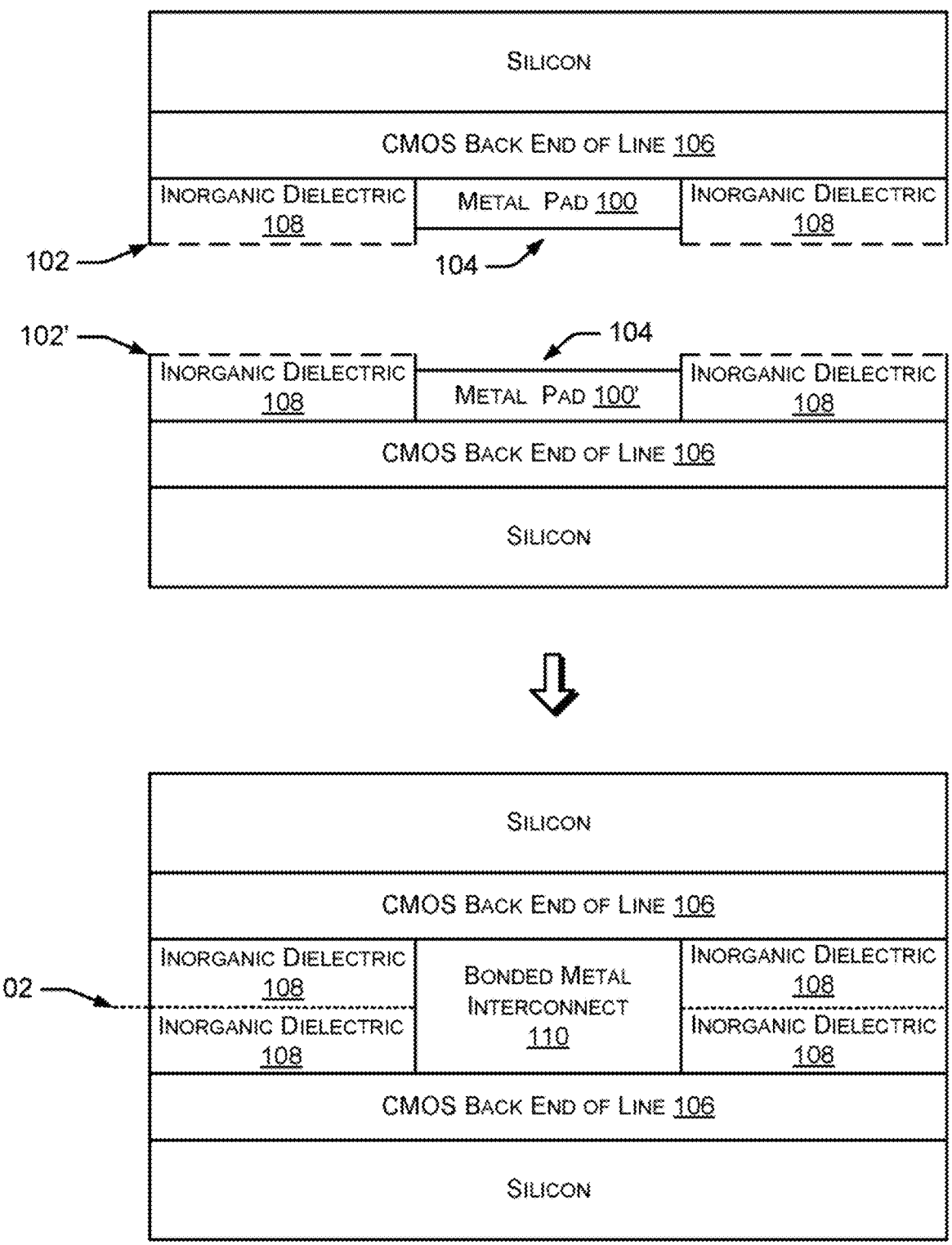
FIG. 1 is a diagram of an example layer structure suitable for making direct metal-to-metal bonds at low annealing temperatures and short annealing durations in microelectronics.

Specifically, as shown in FIG. 1, performing direct hybrid bonding at lower temperatures requires careful control of how far the metal pads 100 & 100' to be bonded can be recessed from the bonding interface plane 102 itself. This retraction of the metal pads 100 & 100' from the plane of the larger bonding interface 102 is known herein as the "maximum recess distance" 104 or just "recess" 104, and ranges from 0 nanometers (nm) to the maximum recess allowed. Protrusion of a metal pad 100 above the horizontal plane 102 before the annealing step is generally not allowed or not preferred. In turn, the lower tolerances imposed on this recess parameter 104 to achieve lower annealing temperatures, trigger a need for careful control of chemical-mechanical planarization (CMP) operations for flattening dies and wafers, which establish the plane of the bonding interface 102 and the resulting recess distance 104 of metal contacts in the first place.

In an implementation, to enable direct bonding of metal interconnects at low temperatures, the maximum recess distance 104 between the metal pads 100 that are to be bonded and the horizontal plane of the larger bonding interface 102 is designed to be only a few nanometers (per side), and the metal pads 100 and structures 106 underlying the metal pads 100 are designed to expand with a calculated thermal expansion sufficient to raise each metal pad 100 into an opposing metal pad 100' belonging to the other surface being joined, in order to direct-bond the metal pads 100 & 100' into a single metal interconnect 110 after the bond. The maximum recess distance 104 between each metal pad 100 and its respective larger bonding interface 102 or 102' is critical for achieving low-temperature direct bonding. If the specification for recess distance 104 is too small, for example, then control of the CMP process control is difficult and the risk of having the metal pad 100 protrude above the dielectric surface 102 increases. If the metal pads 100 are slightly higher than the larger bonding interface 102, then no dielectric bonding in layer 108 occurs around the protruded pads. If a sufficient number of the protruded pads disrupt bonding of the surrounding larger dielectric surface 102, bonding failure occurs.

On the other hand, if the recess distance 104 is too large, then the metal pads 100 & 100' do not expand enough at the lower annealing temperature to make contact at the bonding interface 102, once thermal expansion of the metal pads 100 and the underlying structures 106 is spent. This results in oxide-to-oxide bonding of the nonmetal parts 108 of the bonding interface 102, but no bonding of the metal pads 100 & 100', since the metal pads 100 & 100' never make contact with each other across the bonding interface 102. The dielectric surfaces bond, but with no electrical interconnects across the joined surfaces.

When copper is the metal being direct-bonded, higher temperatures of an annealing step can actuate changes in grain-size for the copper metal on each side of the metal-to-metal bond. This too can be reckoned favorably into low-temperature direct bonding. Likewise, the metal surfaces 100 to be bonded can be intentionally modified to favor bonding at lower temperatures. Conventionally, the CMP process presents surfaces of pure materials, at which metal areas of the flattened surface are free of oxides and impurities. The bonding surface can be activated with plasma, to decrease activation energy for forming bonds and to create some disruption in charge balances at the surface that favors bond formation. In an implementation herein, metal pads 100 to be direct-bonded as interconnects may also be topped by creating nanoparticles of the metal on the bonding surface, to increase the bonding surface area exponentially and physically catalyze or seed metallic direct-bonding. In another implementation, selection of a copper crystal plane increases the rate that copper atoms diffuse across the bonding interface to form permanent metal-to-metal bonds, thereby enabling a reduced annealing temperature and shorter annealing durations.

Figure 2:
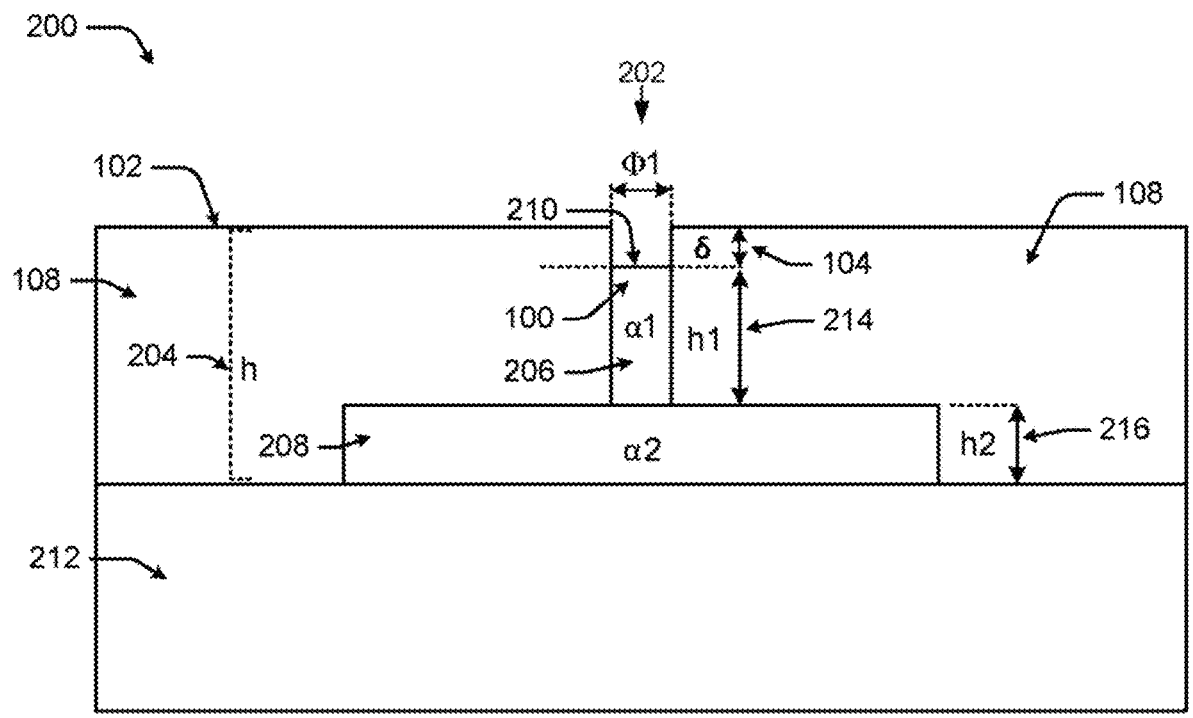
FIG. 2 is a diagram of an example device with example layer structure for making direct metal-to-metal bonds, including a recess distance for bonding pads obtainable in high volume manufacturing.
Figure 2:
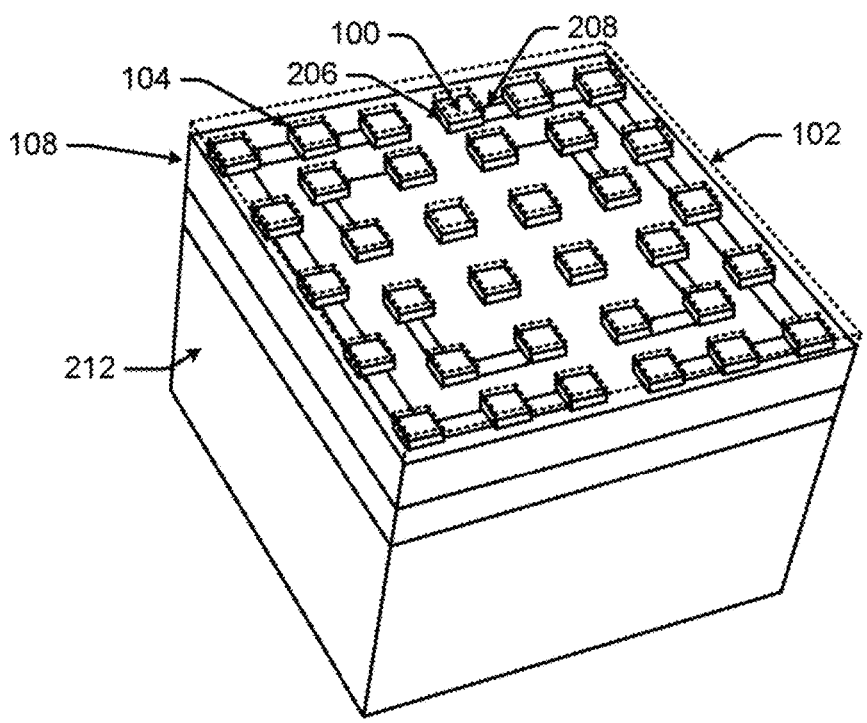

FIG. 2 shows an example layer structure 200 in a microelectronic device in which a metal pad 100 is recessed a distance 104 from the plane of a bonding interface 102. The recess distance 104 is not to scale in FIG. 2, and is shown greatly exaggerated for descriptive purposes. The dielectric layer 108 of the bonding interface 102 has a surface in a horizontal plane. A via 202 is disposed vertically in the horizontal surface of the dielectric layer 108. A vertical stack 204 of conductive layers 206 & 208 resides in the via 202. The conductive layers 206 and 208 may have more than one metal composition and each conductive layer 206 & 208 in the vertical stack 204 has a respective coefficient of thermal expansion (COE), labeled $\alpha 1$ & $\alpha 2$.

From the horizontal surface of the bonding interface 102, the recess distance 104 of the top surface 210 of the first conductive layer 206 in the vertical stack 204 varies by temperature, because the conductive layers 206 & 208 expand or contract in relation to the temperature. For a given layer structure 200, the recess distance 104 at room temperature has a specific range for a given annealing temperature for direct metal-to-metal bonding. The recess is dependent on the volume and geometry of the two conductors 206 & 208 in the vertical stack 204, and their respective coefficients of thermal expansion $\alpha 1$ & $\alpha 2$.

In an implementation, at an annealing temperature below conventional annealing temperatures around 250° C., the vertical stack 204 thermally expands so that at least part of the top surface 210 of the first conductive layer 206 expands or bulges over the recess distance 104 to the horizontal surface of the bonding interface 102, putting the top surface 210 in position for making a direct metal-to-metal bond at the bonding interface 102 with another instance of a vertical stack 204 on the other side of the bonding interface. The actual annealing temperature may be between 150-200° C., or may be around 150° C., or may even be below 150° C. These approximate temperatures are much lower than conventional temperatures around 250° C. needed for the anneal step in direct hybrid bonding.

In this implementation, the second conductive layer 208 of the vertical stack 204 resides below the first conductive layer 206 and is conductively connected to the first conductive layer 206. The second conductive layer 208 may have a second coefficient of thermal expansion $\alpha 2$.

At least one bottom layer 212 beneath the vertical stack 204 consists of the material of a semiconductor die or wafer, or a substrate material, such as glass, dielectric, conductor, etc.

The dielectric confinement layer 108, such as silicon dioxide, provides a confinement matrix around the vertical conductive stack 204, and has substantially lower CTE than the metal stack 204 in order to provide substantial confinement of horizontal expansion forces of the metal stack 204 and thereby generate substantial vertical expansion in the buried conductive layer 208. The dielectric layer 108 is rigid enough to substantially constrain most expansion of the vertical stack 204 to within the vertical stack 204 itself. Thus, by confining expansion forces, the dielectric layer 108 transforms horizontal thermal expansions of the first conductive layer 206 and the second conductive layer 208 into vertical expansion within the vertical stack 204. Example processes for building the dielectric layer(s) 108 and example vertical conductive stacks 204 are described below, with respect to FIG. 8, for example.

Figure 3:
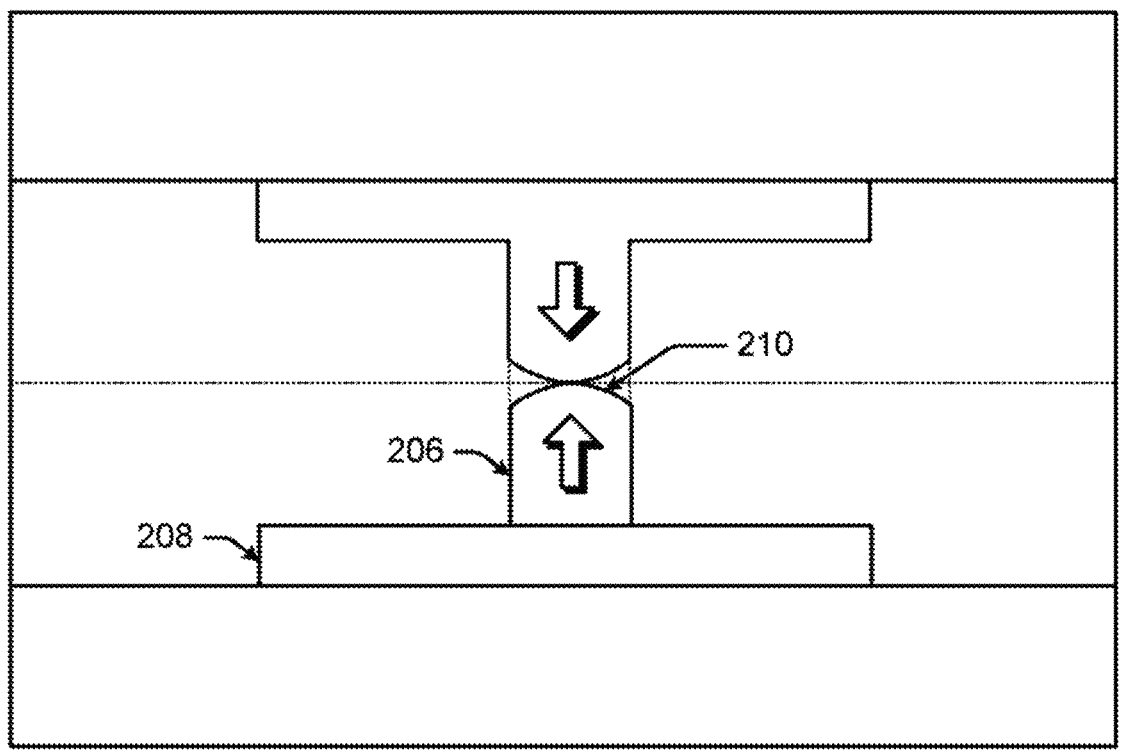
FIG. 3 is a diagram showing a geometry of thermal expansion of a metal bonding surface for direct metal-to-metal bonding.

As shown in FIG. 3, the combined vertical thermal expansion of the first conductive layer 206 and the second conductive layer 208 expand the top surface 210 so that at least a part of the top surface 210 of the first conductive layer 206 bulges, deforms, expands, and/or moves across the recess distance 104 up to the horizontal surface of the bonding interface 102 at an annealing temperature around approximately 150° C. or below.

Referring again to FIG. 2, the dielectric layer 108, when made of silicon dioxide for example, has a coefficient of thermal expansion (CTE) of approximately $0.55 \times 10^{-6}$/° C. and a hardness of 7 Mohs. In some implementations, other materials may be used for the dielectric 108. A suitable dielectric 108 may have a CTE equal to or greater than that of silicon dioxide, for example, which has a very low CTE.

In an implementation, the maximum recess distance 104 is determined as in Equation (1), by:

$$\delta = \alpha^* \times h \times \Delta T \tag{1}$$

wherein $\delta$ is the recess distance 104, $\alpha^*$ is an effective CTE of the vertical stack 204 of conductive layers 206 & 208, h is a thickness of the vertical stack 204 of conductive layers 206 & 208, which consist of three components: $\alpha^*_1$, $\alpha^*_2$, and $\alpha^*_3$, and $\Delta T$ is the temperature change between the room temperature and the annealing temperature.

$$\alpha^* = \alpha^*_1 + \alpha^*_2 + \alpha^*_3. \tag{2}$$

The first component ($\alpha^*_1$) of the effective CTE $\alpha^*$ of the entire vertical stack 204 of conductive layers 206 & 208 represent the vertical component of thermal expansion of the stack 204 and can be approximated by a composite CTE of the vertical stack 204 of the layers 206 & 208. The composite CTE of the vertical stack 204 can be determined in Equation (2), by:

$$\alpha^*_1 = \alpha 1 \times h1/(h1+h2) + \alpha 2 \times h2/(h1+h2) \tag{3}$$

where $\alpha 1$ is the CTE of the first conductive layer 206 of the vertical stack 204, $\alpha 2$ is the CTE of the second conductive layer 208 of the vertical stack 204, h1 is the thickness 214 of the first conductive layer 206, and h2 is the thickness 216 of the second conductive layer 208. The total thickness of metal in the stack 204, consisting of the first conductive layer 206 and the second conductive layer 208 and any optional additional layers, increases the thermal expansion beyond what can be achieved without a stacked structure, such as having only the first conductive layer 206. The combined thickness h=h1+h2 of the metal stack 204 is greater than thickness h1 of the first conductive layer 206 alone, and therefore lowers the annealing temperature for a given value of the metal recess distance 104.

The second component ($\alpha^*_2$) of the effective CTE $\alpha^*$ of the entire vertical stack 204 is the contribution ($\alpha^*_2$) of the horizontal expansion of the second buried metal layer 208, which is converted to vertical expansion because of confinement by the dielectric 108. When the horizontal footprint of the buried metal layer 208 is larger than that of the first buried conductive layer 206 above it, the $\alpha^*_2$ contribution is even more significant.

The third component of the effective CTE $\alpha^*$ of the vertical stack 204 ($\alpha^*_3$) is related to the surface area $\varphi 1$ of the top surface 210 of the first conductive layer 206, this surface 210 can be the metal "pad" to be bonded. The movement of the outer edge of conductive layer 206 is constrained by the dielectric confinement matrix 108, since the two are adjacent. During design, increasing the surface area of the top surface 210 of the first conductive layer 206 provides less constraint to thermal expansion in the volume of metal within the first conductive layer 206 that is further away from the interface between the first conductive layer 206 and the constraining dielectric matrix 108. Consequently, at a given annealing temperature, the center portion of the top surface 210 on a large metal pad or conductive layer 206 expands further compared to a small pad with a small top surface 210. This contribution to the effective CTE $\alpha^{*\ of}$ the entire vertical stack 204 is captured with $\alpha^*_3$ as in Equation (2).

Structural designs, for example direct metal-to-metal bonding, that incorporate the following features and parameters can substantially reduce the annealing temperature of conductive vias 206 with example recesses 104 greater than 1-2 nm, to below 200° C., and even below 150° C. An example structure has a thick upper metal via 206, with h1 thicker than 0.5 μm for example, in an example range of 0.6-2.0 μm. The upper metal via 206 is conductively conducted to one or more buried metal layers 208, such as one or more trace layers of the BEOL stack layer, to increase effective total stack thickness h 204. When the buried metal layer 208 consists of part of a trace, the buried metal layer 208 can be intentionally thicker than usual trace layers, for example, in the range of 0.5-1.5 μm. The example buried metal layer 208 has a larger footprint (horizontal cross-section) than the via layer 206 above it. The larger than usual top surface area 210 of the upper via 206 also enables a lower annealing temperature for forming metal-to-metal bonds. For example, a conventional circular upper via 206 has a 3 μm diameter top surface 210, while an example enlarged upper via 206 as described herein for lowering the annealing temperature may have an upper circular pad surface 210 with a 5 μm, 10 μm, or 15 μm diameter.

Figure 4:
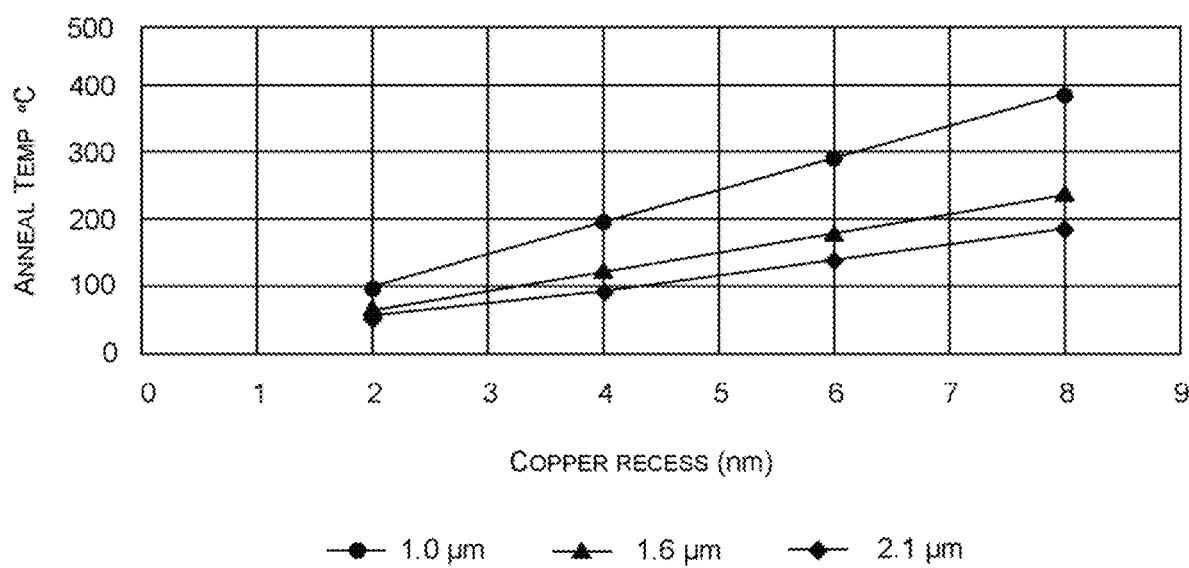
FIG. 4 is a diagram plotting maximum recess distances from a bonding plane versus temperatures, for different thicknesses of a thermally expanding metal contact.

FIG. 4 is a diagram plotting theoretical calculation of differential thermal expansion between Cu metal 206 and the dielectric $SiO_2$ 108 (i.e., the minimum annealing temperature) as a function of annealing temperature and h1 metal thickness 214 using the $\alpha^*_1$ component (vertical thermal expansion) of the overall effective CTE $\alpha^*$. For a given metal thickness 214, if the combination of annealing temperature and metal recess 104 falls below the respective visual line on the plot, the two metal surfaces theoretically will not expand into contact with each other to form a metal-to-metal bond. If the combination falls above the line, metal-to-metal bonding will theoretically happen.

For a given annealing temperature, the larger the metal recess distance 104, the higher the annealing temperature that is required. The smaller the recess distance 104, the lower the required annealing temperature that is required for a metal-to-metal bond to occur. However, for CMP process control and high-volume manufacturing, a very small recess specification is not desirable. By increasing the total metal thickness h1 214 below the via surface 210, the slope of the line gets smaller in the plot, and then for a given recess 104, the calculated annealing temperature is lower with the greater total thickness 214 of the upper metal via 206.

The impact of the metal thickness 214 and other dimensions is demonstrated with the following example. For a 3 μm diameter via 206 with a 6 nm recess distance 104, if the upper metal via 206 has a vertical thickness (h1) 214 of 0.8 μm and the buried trace 208 that the upper metal via 206 is connected to has a vertical thickness (h2) 216 of 0.2 μm for a total metal h thickness 204 of 1.0 μm, then the calculated annealing temperature is close to 300° C. But when the buried metal trace 208 (which can be more than one layer) is increased to 0.8 μm to give a total metal stack thickness (h) 204 of 1.6 μm, then the calculated annealing temperature is reduced to 180° C. When the upper via layer 206 is increase to 1.3 μm for a total metal stack thickness (h) 204 of 2.1 μm, then the calculated annealing temperature is reduced to 130 C. Further increases in the metal stack thickness (h) 204 can further decrease the calculated annealing temperature.

As above, changing the metal recess distance parameter 104 lowers the annealing temperature. Given a total metal stack thickness (h) 204 of 1.6 μm, reducing the Cu recess distance 104 from 6 nm to 4 nm reduces the calculated annealing temperature from a nominal 180° C. to 121° C.

In an implementation, with proper design and combination of materials to optimize confinement by the dielectric 108, the contribution of components $\alpha^*_2$ (horizontal thermal expansion converted to vertical) and $\alpha^*_3$ (surface area of the metal-to-metal bonding surface) of the overall effective CTE reduces the annealing temperature to below even the calculated value. As shown above, with a metal stack thickness (h) of 1.6 um, the calculated minimum annealing temperature using the example parameter for the $\alpha^*_1$ component alone is 180° C., a great improvement over conventional annealing temperatures in direct hybrid bonding. Successful metal-to-metal bonding at lower annealing temperatures have been demonstrated with a total Cu stack thickness (h) 204 of 1.6 μm at 150° C. versus a 180° C. calculated value from using an improved $\alpha^*_1$ (vertical thermal expansion) component alone, due to additional contributions from $\alpha^*_2$ (horizontal thermal expansion converted to vertical) and $\alpha^*_3$ (surface area of the top of metal via or pad being bonded).

In an implementation, a copper first conductive layer 206 has a vertical thickness (h1) 214 of 1.6 μm, and a CTE a1 that is in a range of $16.7\text{-}17.0 \times 10^{-6}/°$ C. The second conductive layer 208 is also copper with a vertical thickness (h2) 216 which may also be around 0.5-1.0 μm, and a CTE α2 that is also in the range of $16.7\text{-}17.0 \times 10^{-6}/°$ C. In this scenario, the maximum recess distance δ is approximately 6 nanometers (nm), and the annealing temperature is lowered down to between 150-200° C.

The second "buried metal" conductive layer 208 of the vertical stack 204 may be at least in part, a part of a redistribution layer (RDL) or an electrical trace of the microelectronic component being fabricated. In an implementation, the RDL or electrical trace making up the second conductive buried metal layer 208 has a horizontal footprint with at least one dimension greater than a corresponding horizontal dimension of the footprint of the first conductive layer 206. The greater footprint of the underlying second conductive layer 208 compared to the first conductive layer 206 provides more thermal expansion through a greater volume of metal, including its horizontal thermal expansion converted to vertical expansion of the vertical stack 204 because of the confinement of horizontal expansion provided by the dielectric confinement matrix 108. This increase in the volume of metal buried deeper beneath the bonding interface 102 and below the first metal via 206 is significant, since only a few nanometers in recess distance 104 lowers the temperature needed for annealing that results in direct metal-to-metal bonds.

Besides pure copper, in a wide variety of implementations, the first conductive layer 206 or the second conductive layer 208 of the vertical stack 204 may be another material, such as a brass alloy with a CTE in a range of $18\text{-}19 \times 10^{-6}/°$ C., a manganese bronze alloy with a CTE of $21.2 \times 10^{-6}/°$ C., an aluminum metal or aluminum alloy with a CTE in a range of $21\text{-}24 \times 10^{-6}/°$ C., a zinc metal or zinc alloy with a CTE in a range of $30\text{-}35 \times 10^{-6}/°$ C., nickel in copper, for example, or another suitable conductor.

Figure 5:
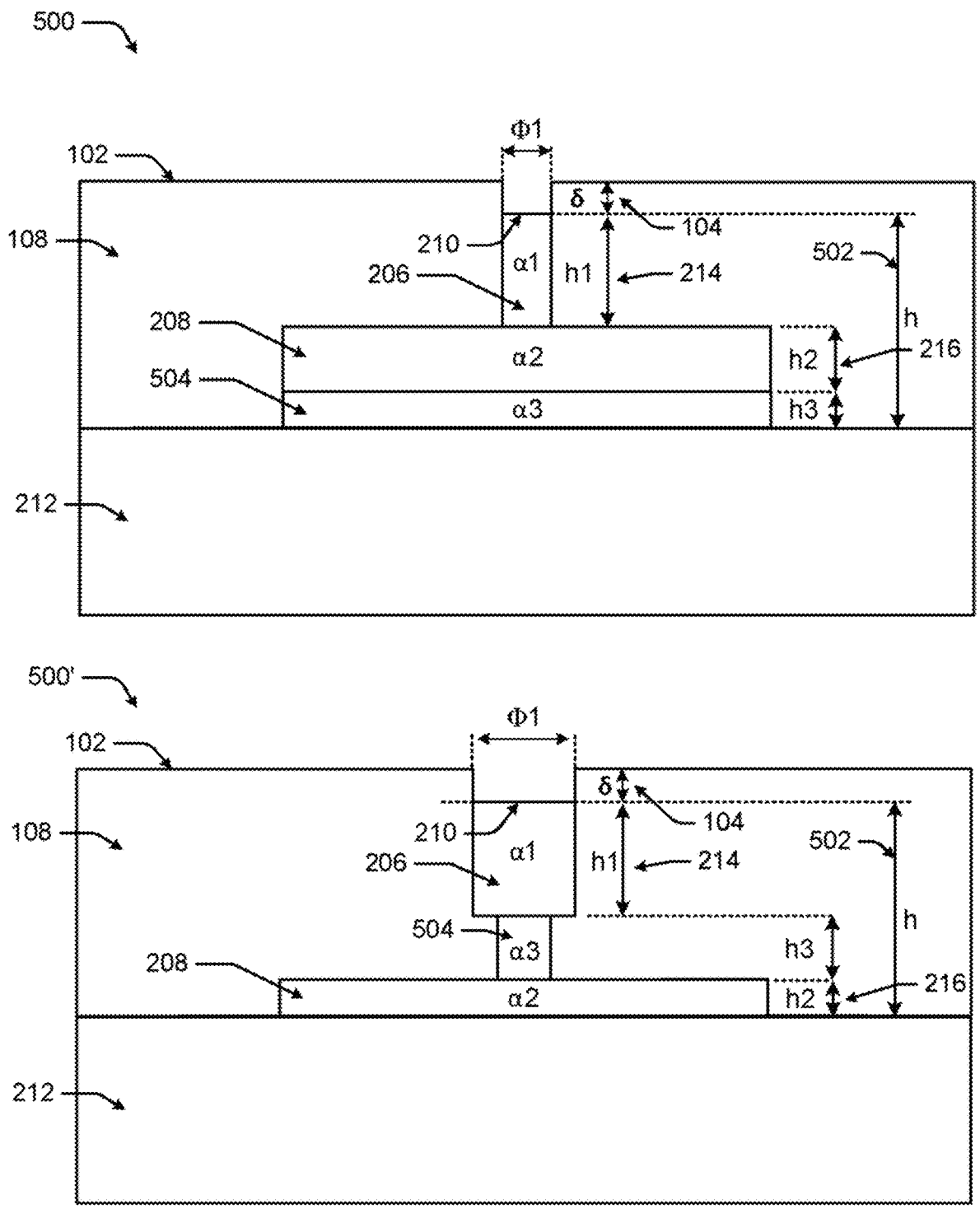
FIG. 5 shows two example diagrams of three conductive layers with respective CTE's within vertical direct-bonding stacks.

FIG. 5 shows other example layered structures 500 & 500' for making direct bonds at low annealing temperatures in microelectronics. In these implementations, the vertical stack 502 may also include a third buried conductive layer 504 of the vertical stack 204, either between the second conductive layer 208 and the bottom layer 212 as in structure 500, or between the first conductive layer 206 and the second conductive layer 208 as in structure 500', for example. Although this example has three conductive layers in the vertical stack 502, the vertical stack 502 may contain up to twelve different layers, for example. Moreover, the layers may have various widths and thicnkesses to optimize the metal expansion effect.

The third conductive layer 504 increases the total stack thickness (h) 502 and may increase the effective CTE $\alpha^*$ by providing a conductor in the vertical stack 502 with a higher CTE than copper metal, for example, thereby providing greater vertical thermal expansion of the entire vertical stack 502, which lowers the annealing temperature needed to form direct metal-to-metal bonds in direct hybrid bonding. The geometry of the third conductive layer 504 may also increase both vertical expansion and effective CTE $\alpha^*$ when the horizontal footprint is relatively large, as in structure 500'. Then the horizontal thermal expansion of the third conductive layer 504 at the annealing temperature tends to be converted to additional vertical expansion of the vertical stack 502 because of the constraining dielectric matrix 108. The third conductive layer 504 may be, for example, a brass alloy with a CTE in a range of $18\text{-}19 \times 10^{-6}/°$ C., a manganese bronze alloy with a CTE of $21.2 \times 10^{-6}/°$ C., an aluminum metal or aluminum alloy with a CTE in a range of $21\text{-}24 \times 10^{-6}/°$ C., a zinc metal or zinc alloy with a CTE in a range of $30\text{-}35 \times 10^{-6}/°$ C., or other suitable conductor.

The example vertical stacks 502 in FIG. 5 may be confined on at least 3 sides (for example, a trace has the bottom and two sides constrained, the top surface connects to the via 206. All sides adjacent to barrier layers or hardened barrier material or confining dielectric matrix 108 further contain sideways and horizontal expansion forces, converting these forces to vertical expansion forces as their temperature approaches the annealing temperature, expanding the top surface 210 of the first conductive via 206 to the level of the bonding interface 102. This confinement leading to increased vertical expansion lowers the annealing temperature needed to form metal-to-metal bonds in direct hybrid bonding.

In an example implementation, the first conductive layer 206, which is the direct bonding layer, has a top surface 210 with dimensions of a circular via 5 μm in diameter. The diameter may also be 2 μm, 3 μm, 5 μm, 10 μm and 15 μm, and other sizes, for example. The vertical thickness (h2) of the first conductive layer 206 can be approximately 1.5 μm, and the second conductive layer 208, which may be an RDL layer, has dimensions of 20 μm×20 μm×0.5 μm, for example. In this example, the metal volume of the first conductive layer 206 is 2.5 μm×2.5 μm×3.14×1.5 μm=29 μm³, for example. The volume of the second conductive layer 208 is 200 μm³, for example. The buried metal volume of the second conductive layer 208 is approximately 7 times that of the first conductive layer 206. Even if only a fraction of horizontal thermal expansion of the second conductive layer 208 is deformed to vertical expansion of the first conductive layer 206, this additional expansion significantly increases the effective CTE $\alpha^*$ and substantially reduces annealing temperature for the metal-to-metal bonding.

In another example, the volume of the first conductive layer 206 is 265 μm³, for example, and the volume of the "buried" second conductive layer 208 is 327 μm³, for example. In this case, the contribution of thermal expansion from the layer 206 and layer 208 is approximately same magnitude assuming that the two layers have the same CTE.

Figure 6:
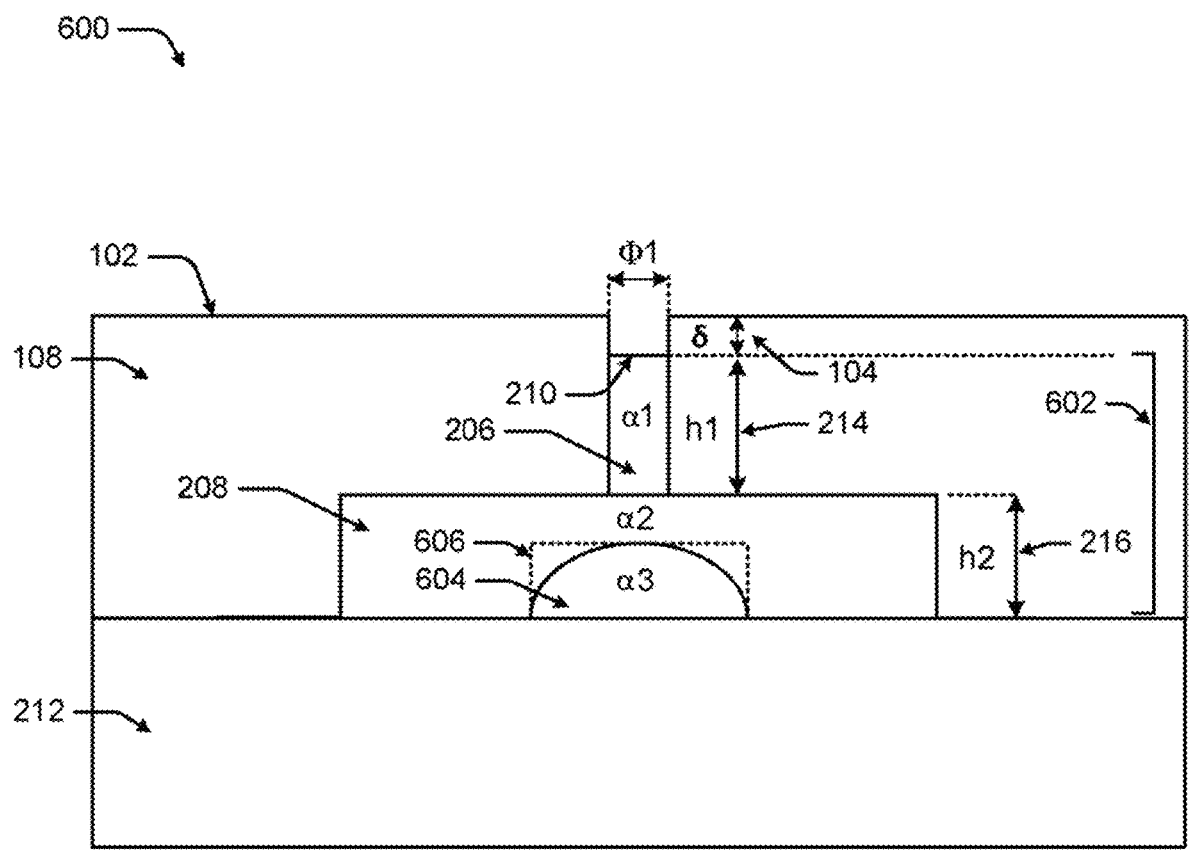
FIG. 6 shows a buried metal bump or inlay of an organic material with high CTE providing vertical thermal expansion to lower annealing temperature and shorten annealing durations during an example direct hybrid bonding process.

FIG. 6 shows another example layered structure 600 for making direct bonds at low temperatures in microelectronics. In this implementation, the vertical stack 602 may also include an embedded bump 604 or an inlay 606 made of a conductor, or other material, with a higher CTE than copper metal for adding additional thermal vertical expansion to the vertical stack 602. The embedded bump 604 or inlay 606 may be a material such as a brass alloy with a CTE in a range of $18\text{-}19 \times 10^{-6}/°$ C., a manganese bronze alloy with a CTE of $21.2 \times 10^{-6}/°$ C., an aluminum metal or aluminum alloy with a CTE in a range of $21\text{-}24 \times 10^{-6}/°$ C., a zinc metal or zinc alloy with a CTE in a range of $30\text{-}35 \times 10^{-6}/°$ C., or other suitable metal or non-metal material.

The embedded bump 604 or inlay 606 can also be a dielectric material, such as an organic material (nonmetal) with a very high CTE, as long as the bump 604 or inlay 606 does not block an electrical conduction path, for example between an electrical trace and the via 206 with the top surface 210 forming the direct metal-to-metal bond. The organic material with high CTE can also be a buried layer, such as layer 504 in structure 500 of FIG. 5, as long as the buried layer 504 does not block an electrical conduction path. The organic material with high CTE for the buried layer 504 or the embedded bump 604 or inlay 606 may be a polyimide with a CTE in a range of $30\text{-}60 \times 10^{-6}/°$ C., an epoxy with a CTE in a range of $45\text{-}65 \times 10^{-6}/°$ C., a chlorinated polyvinylchloride CPVC with a CTE in a range of $63\text{-}66 \times 10^{-6}/°$ C., a phenolic resin with a CTE in a range of $60\text{-}80 \times 10^{-6}/°$ C., a nylon with a CTE in a range of $50\text{-}90 \times 10^{-6}/°$ C., an ABS thermoplastic with a CTE in a range of $22\text{-}108 \times 10^{-6}/°$ C., a polybutylene with a CTE in a range of $130\text{-}139 \times 10^{-6}/°$ C., an ethylene vinyl acetate with a CTE of $180 \times 10^{-6}/°$ C., and an ethylene ethyl acrylate with a CTE of $205 \times 10^{-6}/°$ C.

Referring to FIGS. 2, 5, and 6, the thickness (h1) 214 of the first conductive layer 206 may be increased proportionately to greater than the example nominal 1.6 μm vertical dimension, at a recess distance 104 of 6 nm, in order to lower the annealing temperature further below a nominal temperature of 200° C. for the anneal step of direct hybrid bonding. The greater thickness (h1) 214 for the first conductive layer 206 provides proportionately greater vertical thermal expansion of the vertical stack 204, enabling the same amount of vertical expansion at a lower temperature as provided by a lesser thickness 214 of the first conductive layer 206 at a higher temperature.

Figure 7:
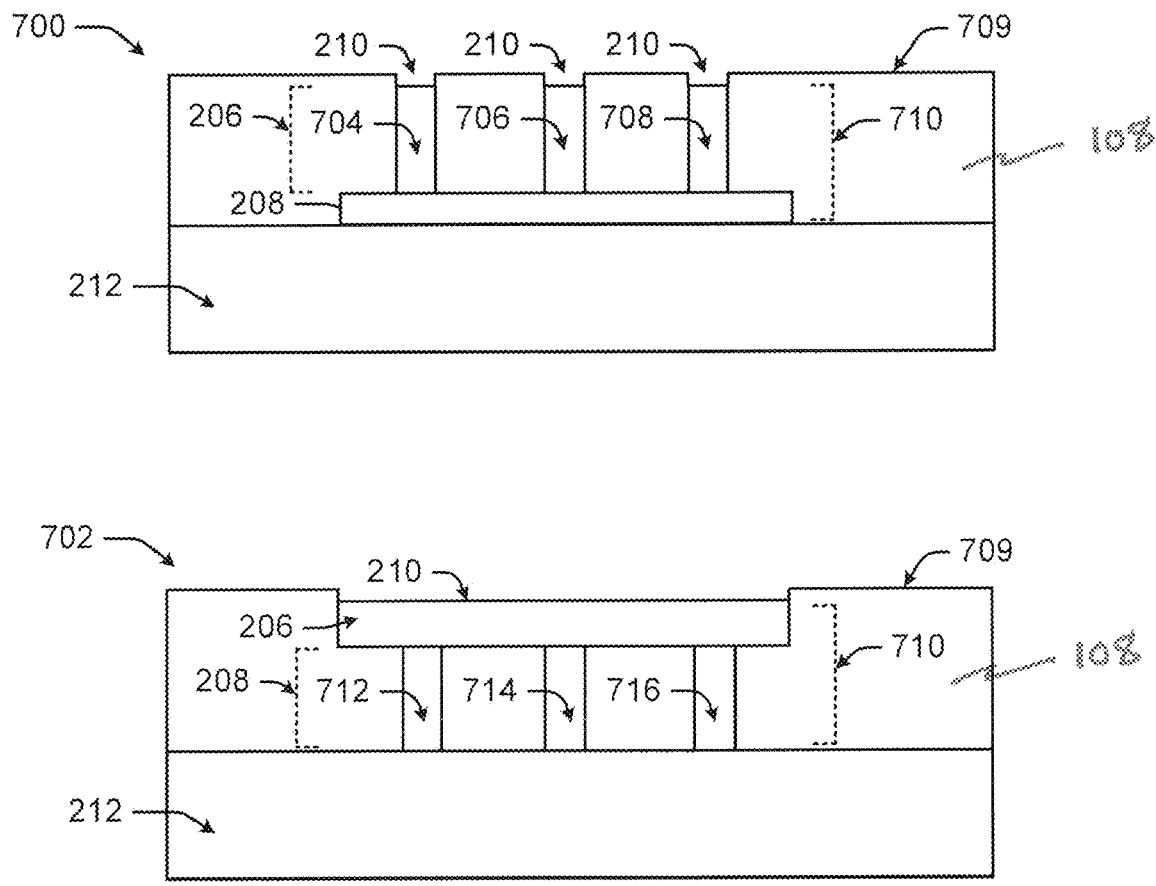
FIG. 7 is a diagram showing multiple parallel vias as either a first conductive layer or second conductive layer in direct metal-to-metal bonding.

FIG. 7 shows additional example layered structures 700 & 702 for making direct bonds at low temperatures in microelectronics. In an implementation, multiple parallel conductive vias 704 & 706 & 708 make up the first conductive layer 206, and are each surrounded by the dielectric confinement material 108, over a single second conductive layer 208. The first conductive layer 206 is the direct-bonding layer, with top surfaces 210 recessed from the dielectric oxide surface 709. The multiple parallel conductive vias 704 & 706 & 708 each conductively couple to the single second conductive layer 208, which may be an RDL (redistribution layer). The multiple parallel conductive vias 704 & 706 & 708 in the first conductive layer 206 provide multiple bonding opportunities for the same connection to increase yield and reliability through redundancies.

In another implementation, the example structure 702 in FIG. 7 includes a second conductive layer 208 that has multiple parallel conductive vias 712 & 714 & 716 surrounded by the dielectric confinement filler 108, beneath the single first conductive layer 206. The second conductive layer 208, including the multiple parallel conductive vias 712 & 714 & 716, may be an RDL (redistribution layer) on a die or wafer. The multiple parallel conductive vias 712 & 714 & 716 each conductively couple to the single first conductive layer 206, which is the direct-bonding metal layer with large area top surface 210. This arrangement provides a greater direct-bonding surface area $\varphi 1$ than a single via for direct-bonding, and also enables the direct metal-to-metal bonding to occur at lower temperatures than conventionally used for the annealing step because of the greater surface area $\varphi 1$ of the top surface 210, which can enable the center of the large top surface 210 to deform upward more than the edges of the large top surface 210.

Figure 8:
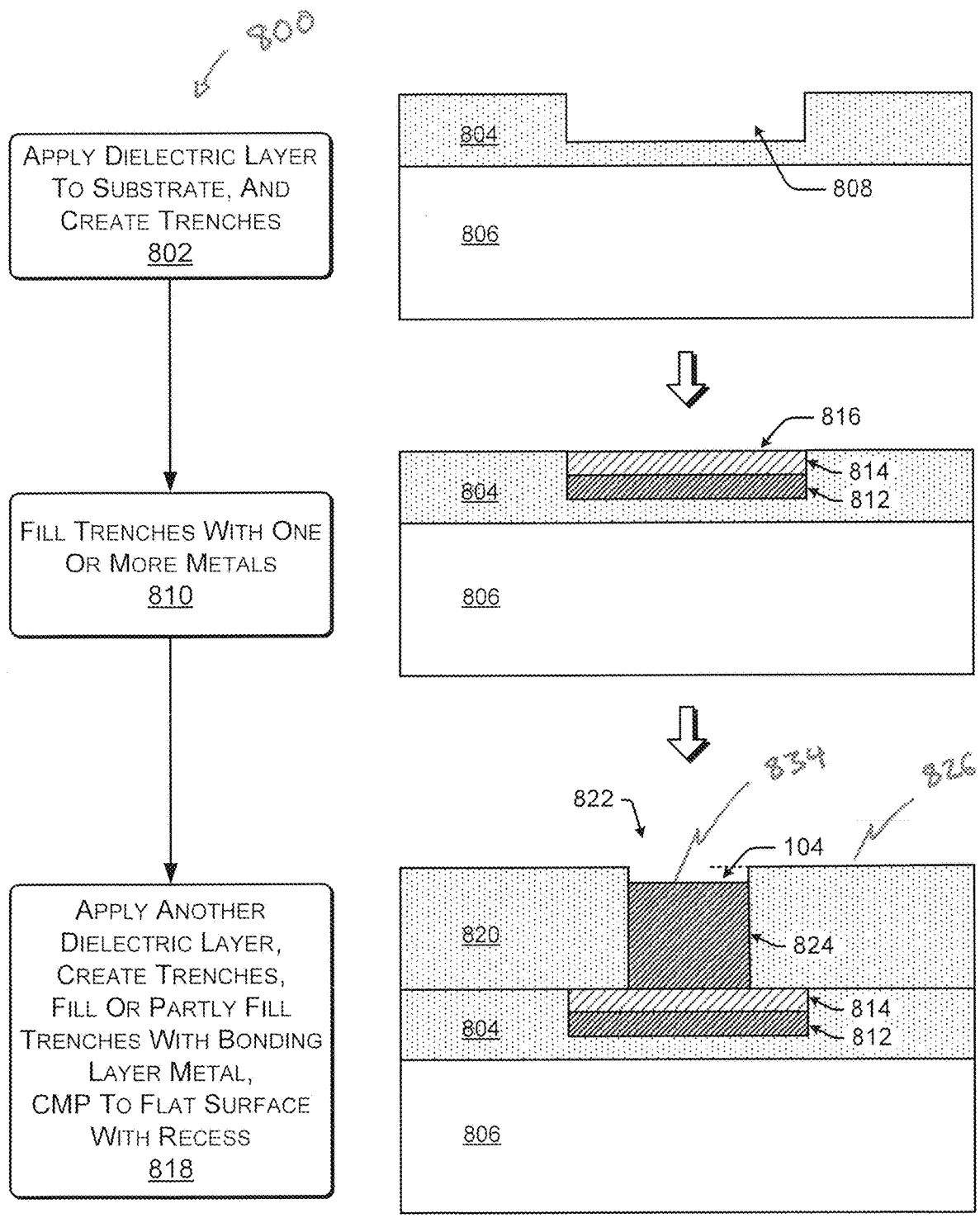
FIG. 8 is a diagram showing an example process flow for creating a bonding interface structure that enables direct metal-to-metal bonding with lower annealing temperatures and shorter annealing time than conventionally used.

FIG. 8 shows an example process flow 800 for creating a bonding interface structure, such as structure 500 in FIG. 5, for example, that enables direct metal-to-metal bonding with lower annealing temperatures and shorter annealing times than conventionally used. Steps of the example process flow are shown as individual blocks and corresponding diagrams.

At block 802, a dielectric material 804 is formed or deposited on a semiconductor or other substrate 806, and trenches 808 are formed in the dielectric material 804 for confining one or more metal layers. The trenches may be etched trenches and/or damascene cavities, for example.

At block 810, a barrier layer and/or adhesion layer and metal seed layer are applied at least in the trenches 808 for metal deposition. The trenches 808 are then filled with one or more metals 812 & 814, in one or more layers, or can be filled with any other multiple layer composition. The top surface 816 of the metal or metals is flattened with a CMP process to remove excess deposition.

At block 818, another layer of dielectric material 820 is deposited, and trenches 822 formed or etched for confining a bonding layer metal 824 ("conductive via") to be added next. The trenches 822 are filled with the bonding layer metal 824, and planarized with CMP to remove the excess deposition. The finished surface 826 after CMP meets the dielectric surface roughness and metal recess 104 specification for an example direct hybrid bonding process.

Figure 9:
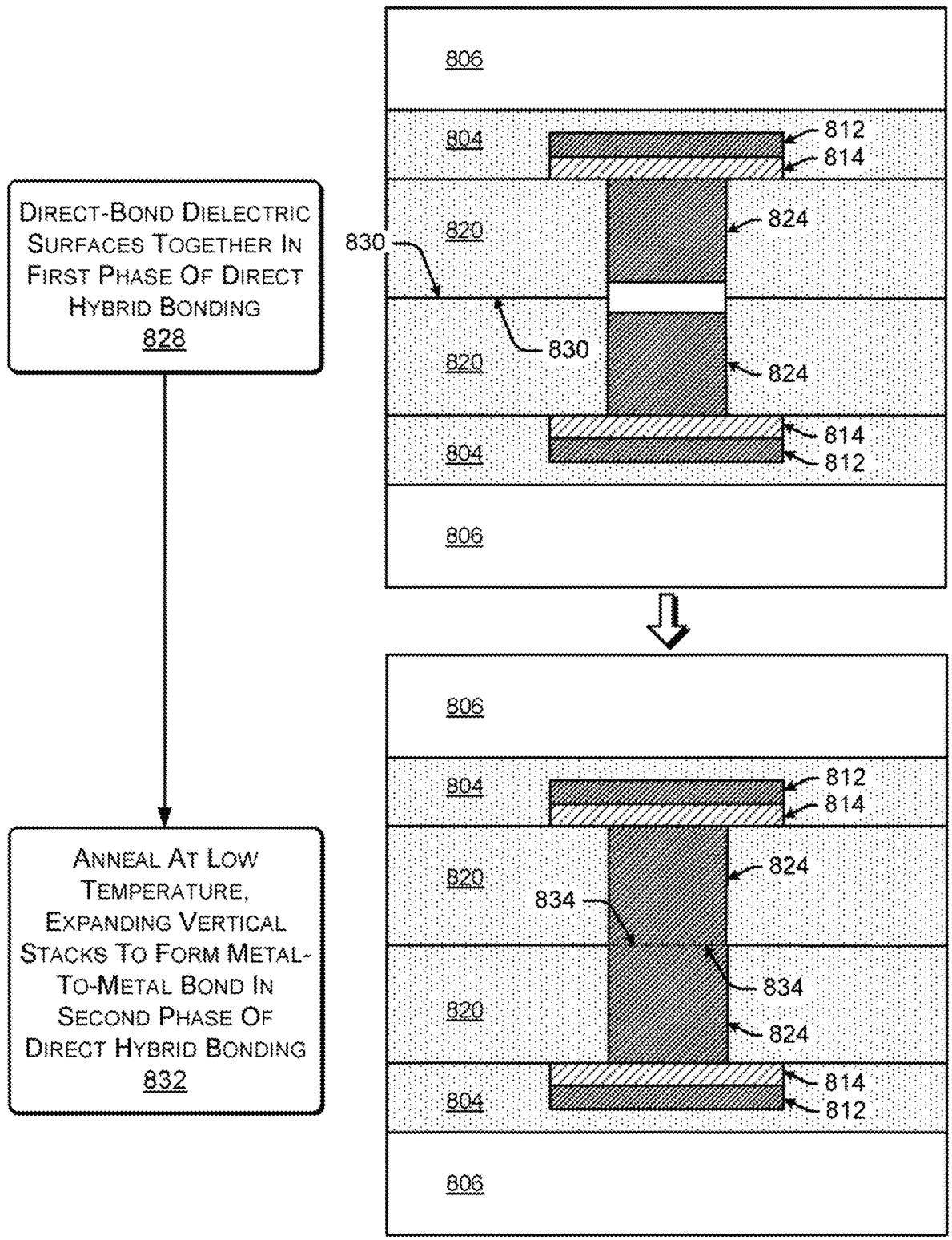
FIG. 9 is a diagram showing instances of the structures formed in FIG. 8 being joined in an example direct hybrid bonding process.

In FIG. 9, the process of FIG. 8 continues, with instances of the structures and bonding surfaces fabricated in FIG. 8 joined in an example direct hybrid bonding process.

At block 828, two instances of the bonding interface structure are bonded together in a first phase of a direct hybrid bonding process. The first phase direct-bonds the oxide surfaces 830 of the inorganic dielectrics together. The joining of surfaces may be in a wafer to wafer (W2W) process, a die-to-wafer (D2W) process, or a die-to-die (D2D) process.

At block 832, the bonded structure is annealed, in a second phase of the direct hybrid bonding process. The raised temperature of the annealing process vertically expands the buried metals 812 & 814 and the bonding layer metal 824, all of these confined by the surrounding dielectric layers 804 & 820 to convert horizontal thermal expansion into vertical expansion. The vertical expansion of the metals 812 & 814 & 824 cause at least part of the top surfaces 816 to bridge the gap of the combined recesses 104 at the lower annealing temperature. The respective top surfaces 834 of the bonding layer metals 824 contact each other and metal atoms diffuse across the interface to form an irreversible metal-to-metal bond between the respective bonding layer metals 824.

Lower annealing temperature is one consideration of low temperature bonding, the second consideration is the annealing duration, which in turn affects the thermal budget for annealing. Lower thermal (energy) budget is desired. There are two components involved in the formation of direct Cu-to-Cu bonds in an example direct hybrid bonding process: 1) the two recessed surfaces expand to bridge the gap and physically contact each other (thermal dynamic consideration); and 2) Cu atoms diffuse across the interface to form permanent bonds (bonding kinetics consideration). It is known that surface diffusion of atoms along the 111 crystal plane is 3-4 orders of magnitude faster than along the 100 or 110 crystal planes (see the reference below). Therefore it is advantageous to have mostly the 111 crystal plane on the surface 834 in order to shorten the annealing time for direct hybrid bonding, especially at lower temperatures because the Cu surface diffusion also slows down when the annealing temperature is reduced.

Table (1) shows calculated Cu surface diffusivity ($cm^2$/sec) on (111), (100), and (110) planes at various temperatures, ranging from 150° C. to 300° C. (Agrawal, P. M. et al., "Predicting trends in rate parameters for self-diffusion on FCC metal surfaces." Surf. Sci. 515, 21-35 (2003))

TABLE 1

| DiffusivitySurf\Temp. | (111) Plane | (100) Plane | (110) Plane |
| --- | --- | --- | --- |
| 300° C. | 1.51 × 10−5 | 1.48 × 10−8 | 1.55 × 10−9 |
| 250° C. | 1.22 × 10−5 | 4.74 × 10−9 | 3.56 × 10−10 |
| 200° C. | 9.42 × 10−6 | 1.19 × 10−9 | 5.98 × 10−11 |
| 150° C. | 6.85 × 10−6 | 2.15 × 10−10 | 6.61 × 10−12 |

Low-temperature direct copper-to-copper bonding is enabled by creep on the (111) surfaces of nanotwinned copper of the nanotexture surface 1004. The grain size of copper metal at the grain boundary of the bonding surface 834 can also affect annealing conditions to lower the annealing temperature. The copper metal grain size is smaller at lower temperatures, so the lower temperatures also favor direct-bond formation in that respect, over higher annealing temperatures.

Figure 10:
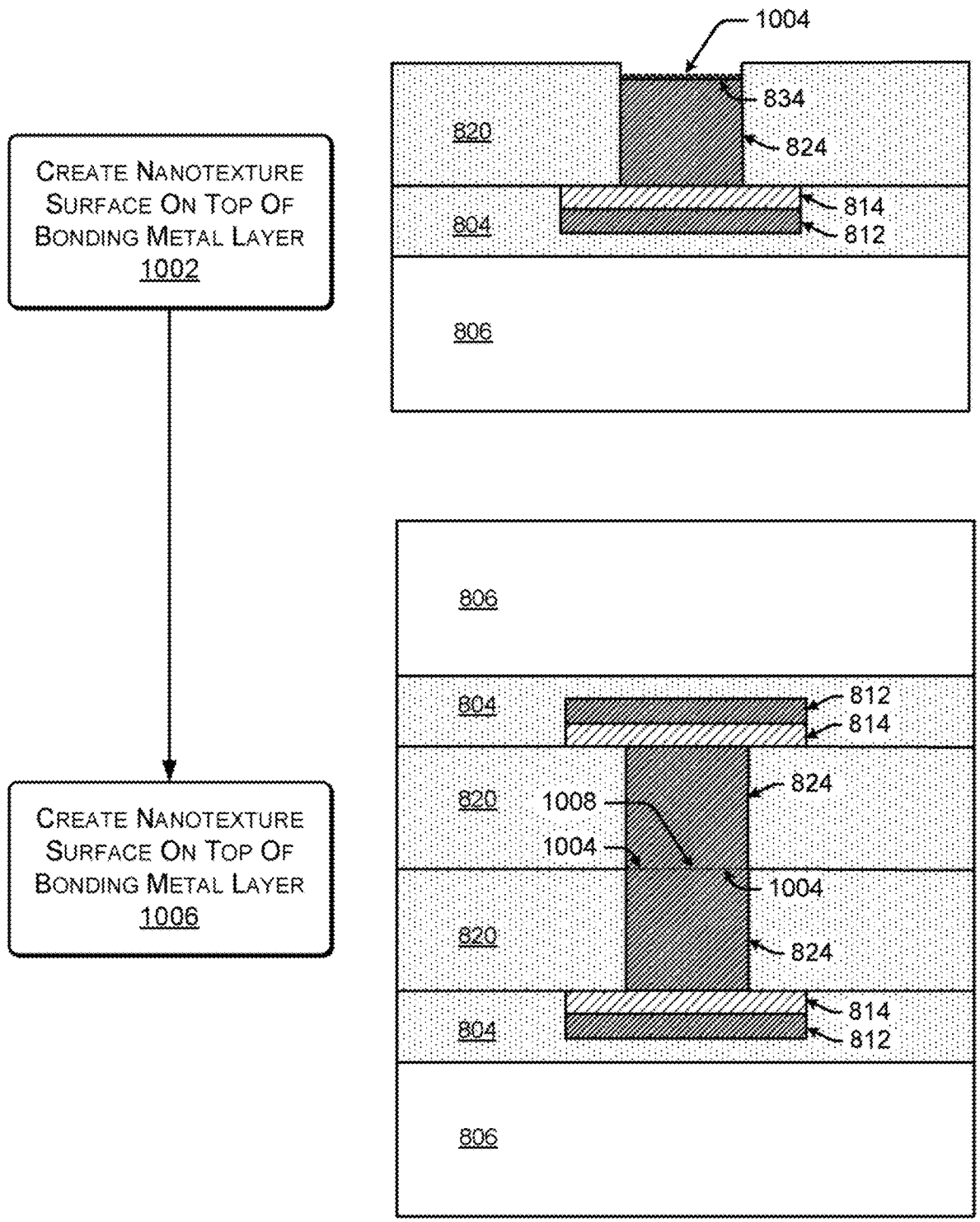
FIG. 10 is a diagram showing an example process of making a nanotextured surface to lower annealing temperatures and shorten annealing time in direct metal-to-metal bonding.

FIG. 10 shows a process of preparing or modifying the top surface 834 of the bonding layer metal 824 to facilitate direct metal-to-metal bonding at lower annealing temperatures and shorter annealing durations. The lower annealing temperatures and shorter annealing durations reduce the overall thermal budget and energy budget of the example direct hybrid bonding process.

Steps of the example process flow are shown as individual blocks and corresponding diagrams. The example process uses the same initial fabrication steps as the process shown in FIG. 8.

In FIG. 10, an example nanotexture surface 1004 may be created on top of the bonding metal layer 824. The nanotexture surface 1004 greatly increases the rate of direct metal-to-metal bond formation when respective top surfaces 834 come in contact with each other during the example direct hybrid bonding process.

The bonding metal layer 834 itself may be formed with a process selected to plate copper metal (Cu) in the 111 crystal orientation (of copper). The copper metal may be deposited from a super-filling electroplating bath, for example, with plating chemistry selected to optimize the direct metal-to-metal bonding to occur during the example direct hybrid bonding. The microstructure of the deposited or coated bonding metal layer 824 may be stabilized, for example by an annealing step, separate from the annealing step of the example direct hybrid bonding that occurs later.

An example nanotexture surface 1004 may also be explicitly formed or retro-formed by applying a nanotexturing process to the top surface 834 of the bonding metal layer 824 to form a high index plane and/or a surface of lattice planes with 111 Miller indices, for example.

In an implementation, the nanotexture surface 1004 can be made several ways. For example, a very dilute acid rinse can be applied to the top surface 834, and the surface can be spun dry in an oxygen ambient, and rinsed with deionized water. Or, the top surface 834 can be rinsed in low acid copper sulfate solution and dried in an oxygen ambient, and then treated with a dilute acid rinse followed by a deionized rinse.

These treatments can create a hexagonal network of screw dislocations in the copper metal surface 834 to create the example nanosurface texture 1004, which can facilitate and accelerate the rate of diffusion of copper atoms across the bonding interface, the atomic process that creates the direct metal-to-metal bond. Facilitating and accelerating the direct metal-to-metal bonding process shortens the duration of the annealing step of the direct hybrid bonding process, even at lower annealing temperatures than are conventionally used. The duration of the example annealing may even be shorter than the duration of conventional annealing with microwave heating and bonding.

At block 1006, instances of the example bonding structures with nanotexture surfaces 1004 are joined for example direct hybrid bonding. The nanotexture surfaces 1004 facilitate faster diffusion of copper atoms across the bonding interface, resulting in a facilitated metal-to-metal bond that occurs faster, and at lower temperature, than in conventional direct bonding processes.

Example Method

Figure 11:
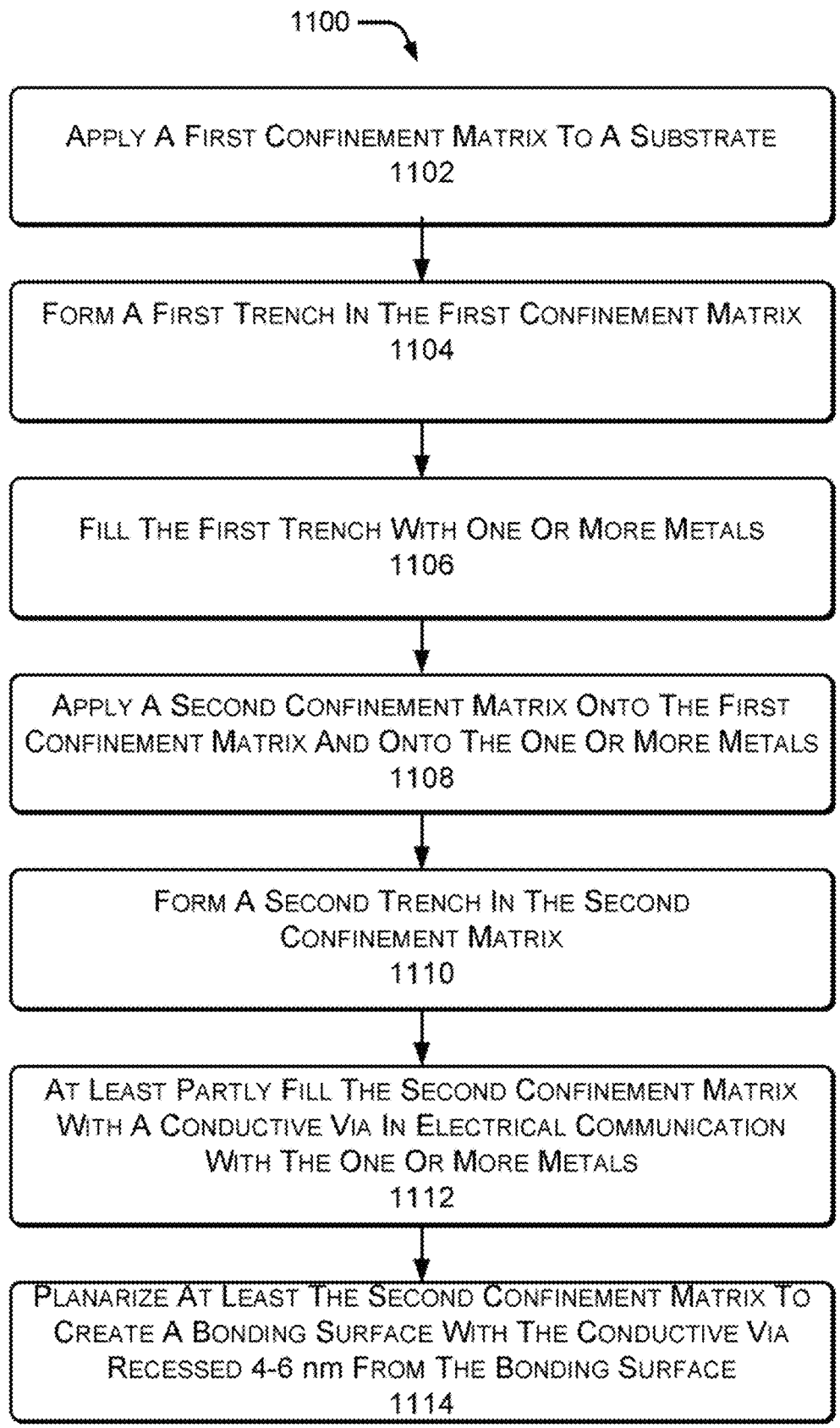
FIG. 11 is a flow diagram showing an example process for making a structure suitable for forming direct metal-to-metal bonds at low annealing temperatures and short annealing durations.

FIG. 11 shows an example method 1100 for making a structure suitable for forming direct metal-to-metal bonds at low annealing temperatures and short annealing durations. Operations of the example method 1100 are shown in individual blocks.

At block 1102, a first confinement matrix layer is applied to a substrate. The confinement matrix can be silicon dioxide or another inorganic dielectric capable of forming direct bonds, such as oxide-to-oxide bonds for example, across a bonding interface.

At block 1104, a first trench is formed in the first confinement matrix. The first trench may be etched and/or formed with damascene processes, for example.

At block 1106, the first trench is filled with one or more metals. The first trench may be filled with 1-12 layers of metals, featuring high CTEs for providing relatively large thermal expansion. The fill may also be one or more metal alloys or compositions.

At block 1108, a second confinement matrix is applied onto the first confinement matrix and onto the one or more metals below. The second confinement matrix may be a different material than the first confinement matrix, or may be the same material, but is applied as a discrete layer.

At block 1110, a second trench is formed in the second confinement matrix. The second trench may be etched and/or formed with damascene processes, for example.

At block 1112, the second trench is at least partly filled with a conductive via in electrical communication with the one or more metals. The conductive via can be copper metal, but can also be other conductors. The metal material of the conductive via must be capable of direct bonding with a like conductive via of the same metal, during an example direct hybrid bonding process.

At block 1114, at least the second confinement matrix is planarized, for example with CMP, to create a bonding surface for direct hybrid bonding, with a top surface of the conductive via recessed 4-6 nanometers (nm) from the planarized bonding surface.

After fabrication of the above structure suitable for forming direct metal-to-metal bonds at low annealing temperatures, a further process includes joining a first instance of the bonding surface with a second instance of the bonding surface to create direct contact bonds between respective second confinement matrices of the first and second bonding surfaces. In other words, the flat and polished surfaces of two instances of the bonding structure are joined together, and the dielectric parts of the surface spontaneously bond together upon contact, in a first phase of an example direct hybrid bonding process.

In a second phase of the example direct hybrid bonding process, annealing the joined bonding surfaces at a temperature equal to or less than 150° C. thermally expands the respective metals in the first trenches and the respective conductive vias in the second trenches to create a direct metal-to-metal bond between the respective conductive vias, at this low temperature. The vertical expansion of the stack of metals causes the top surface of each conductive via to bridge the gap of the pre-designed recess distance that exists at room temperature between the top surface and the bonding surface.

The first trench may be formed with a larger cross-sectional area than the cross-sectional area of the second trench in order to bury more metal under the conductive via that will be undergoing direct metal-to-metal bonding. The large volume of the buried metals creates increased vertical thermal expansion under the conductive via at the annealing temperature that is equal to or less than 150° C. The first confinement matrix also converts horizontal expansion of the one or more buried metals to vertical expansion, to expand the top of the conductive via to the bonding plane, at the lower temperatures.

In an implementation, the method may include filling the first trench with one or more metals having an overall vertical thickness (or height) between approximately 0.5-1.5

µm. The example method also includes creating the second trench with dimensions suitable for forming a conductive via having a circular cross-section with a diameter of 5 µm or greater. The diameter can be much greater, for example 15 µm. The example method then includes filling the second trench with the conductive via, which may have a vertical thickness (or height) between approximately 0.6-2.0 µm.

In an implementation, a nanostructure surface is created on the top surface of the conductive via to lower the annealing temperature and to shorten a duration of the annealing. In an implementation, the nanotexture surface is a hexagonal network of screw dislocations in a copper metal.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

What is claimed is:

1. A method comprising:
   providing a first trench or via in a first dielectric structure of a first substrate, wherein the first trench or via has a first width;
   at least partially filling the first trench or via with one or more metals having a thickness of approximately 0.5-1.5 µm;
   applying a second dielectric structure onto the first dielectric structure and onto the one or more metals;
   forming a second trench or via in the second dielectric structure with a second width that is smaller than the first width;
   at least partly filling the second trench or via with a first conductive material directly in contact with the one or more metals to form a conductive via;
   applying a third dielectric structure onto the second dielectric structure and onto the first conductive material;
   forming a third trench or via in the third dielectric structure with a third width that is larger than the second width but smaller than the first width;
   at least partly filling the third trench or via with a second conductive material directly in contact with the first conductive material to form a metal pad over the conductive via, wherein only a single via connects to the metal pad, the single via comprising the conductive via; and
   preparing the third dielectric structure and the metal pad to form a bonding surface for direct hybrid bonding to a second substrate.

2. The method of claim 1, wherein the metal pad has a thickness above the second trench or via of approximately 0.6-2.0 µm.

3. The method of claim 1, wherein preparing the second third dielectric structure and the metal pad comprises planarizing at least the third dielectric structure.

4. The method of claim 1, further comprising joining the bonding surface with the second substrate to create direct contact bonds between the third dielectric structure and the second substrate, wherein the conductive via comprises a first conductive via and wherein the second substrate comprises a second conductive via.

5. The method of claim 4, further comprising annealing a bonded interface between the first and second substrates after joining at a temperature equal to or less than 150° C. to thermally expand the one or more metals in the first trench or via and the first and second conductive vias on the first and second substrates to create a direct metal-to-metal bond between the metal pad and the second conductive via.

6. The method of claim 1, further comprising creating a nanostructure surface on the surface of the metal pad.

7. The method of claim 1, wherein the conductive via has a thickness above the first trench of greater than 0.5 µm.

8. A method comprising:
   providing a first trench or via in a first dielectric structure of a first substrate, wherein the first trench or via has a first horizontal dimension and a first thickness;
   filling the first trench or via with one or more metals;
   applying a second dielectric structure onto the first dielectric structure and onto the one or more metals;
   forming a second trench or via in the second dielectric structure;
   at least partly filling the second trench or via with a conductive material directly in contact with the one or more metals to form a first conductive via having a second thickness above the first trench that is greater than the first thickness and that is at least 0.5 µm, wherein the first conductive via has a first portion and a second portion, wherein the first portion is between the second portion and the one or more metals and has a second horizontal dimension, wherein the second portion has a third horizontal dimension that is greater than the second horizontal dimension but less than the first horizontal dimension, wherein the second portion comprises a first metal pad, and wherein a second conductive via that is a nearest conductive via to the first conductive via in the second dielectric structure comprises a second metal pad that is spaced apart from the first metal pad; and
   preparing the second dielectric structure, the first metal pad and the second metal pad to form a bonding surface for direct hybrid bonding to a second substrate.

9. The method of claim 8, wherein the first thickness is approximately 0.5-1.5 µm.

10. The method of claim 8, wherein the second dielectric structure comprises multiple dielectric layers.

11. The method of claim 8, wherein the first portion of the first conductive via has a different thickness than the second portion of the first conductive via.

12. The method of claim 8, wherein the second thickness is approximately 0.6-2.0 μm.

13. The method of claim 8, wherein the second dielectric structure comprises a single dielectric layer.

14. A method comprising:
providing a first dielectric structure over a semiconductor layer, an upper surface of the first dielectric structure forming a portion of a first bonding surface of a first microelectronic device;
providing a first buried conductive layer embedded in the first dielectric structure over the semiconductor layer, the first buried conductive layer having a first horizontal dimension and a first thickness;
providing a plurality of conductive via structures spaced apart in the first dielectric structure, each conductive via structure of the plurality of conductive via structures including a contact pad portion and a single via portion connected to the contact pad portion, the plurality of conductive via structures including at least a first conductive via structure connected to the first buried conductive layer and a second conductive via structure, wherein the single via portion has a second horizontal dimension less than the first horizontal dimension and a second thickness greater than the first thickness, wherein the contact pad portion has a third horizontal dimension greater than the second horizontal dimension and less than the first horizontal dimension; and
hybrid bonding a second microelectronic device to the first bonding surface without adhesive along a bond interface.

15. The method of claim 14, wherein providing the plurality of conductive via structures comprises providing a second buried conductive layer embedded in the first dielectric structure, the second buried conductive layer comprising the single via portion of each conductive via structure.

16. The method of claim 15, wherein providing the plurality of conductive via structures further comprises providing a third conductive layer over and electrically connected to the second buried conductive layer, the third conductive layer comprising the contact pad portion.

17. The method of claim 14, wherein the contact pad portion has a third thickness greater than 0.5 μm.

18. The method of claim 17, wherein the third thickness is in a range of 0.6-2 μm.

19. The method of claim 14, wherein the first thickness is in a range of 0.5-1.5 μm.

20. The method of claim 19, wherein the first thickness is in a range of 0.5-1 μm.

21. The method of claim 14, wherein providing the first dielectric structure comprises providing a plurality of dielectric layers of a back-end-of-line (BEOL) stack.

22. The method of claim 14, wherein the first dielectric structure comprises silicon oxide.

23. The method of claim 14, wherein the third horizontal dimension is 5 μm or greater.

* * * * *